US012615018B2

(12) United States Patent
Yahata

(10) Patent No.: US 12,615,018 B2
(45) Date of Patent: Apr. 28, 2026

(54) AMPLIFIER MODULE AND COMMUNICATION DEVICE

(71) Applicant: Sumitomo Electric Industries, Ltd., Osaka (JP)

(72) Inventor: Yusuke Yahata, Osaka (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 656 days.

(21) Appl. No.: 17/924,454

(22) PCT Filed: May 24, 2021

(86) PCT No.: PCT/JP2021/019591
§ 371 (c)(1),
(2) Date: Nov. 10, 2022

(87) PCT Pub. No.: WO2021/241491
PCT Pub. Date: Dec. 2, 2021

(65) Prior Publication Data
US 2023/0318533 A1    Oct. 5, 2023

(30) Foreign Application Priority Data

May 25, 2020    (JP) ................................. 2020-090328

(51) Int. Cl.
*H03F 1/02* (2006.01)
*H03F 1/56* (2006.01)
*H03F 3/24* (2006.01)

(52) U.S. Cl.
CPC ............. *H03F 1/0288* (2013.01); *H03F 1/56* (2013.01); *H03F 3/245* (2013.01); *H03F 2200/451* (2013.01)

(58) Field of Classification Search
USPC ..................................................... 330/84, 295
See application file for complete search history.

(56) References Cited

U.S. PATENT DOCUMENTS

| | | |
|---|---|---|
| 2012/0019326 A1 | 1/2012 | Deguchi et al. |
| 2012/0133442 A1 | 5/2012 | Blednov |
| 2013/0169366 A1 | 7/2013 | Deguchi et al. |
| 2018/0175802 A1 | 6/2018 | Wu et al. |

FOREIGN PATENT DOCUMENTS

| | | |
|---|---|---|
| JP | 2012-028880 A | 2/2012 |
| WO | 2016/013047 A1 | 1/2016 |

*Primary Examiner* — Andrea Lindgren Baltzell
*Assistant Examiner* — Malane Lieng
(74) *Attorney, Agent, or Firm* — Volpe Koenig

(57) ABSTRACT

An amplifier module includes a Doherty amplifier circuit, and the Doherty amplifier circuit includes a first transistor chip constituting a carrier amplifier, a first output signal line configured to transmit a first amplified signal outputted from the carrier amplifier, a second transistor chip constituting a peak amplifier, and a second output signal line configured to transmit a synthetic signal of the first amplified signal and a second amplified signal outputted from the peak amplifier. A direction from a drain terminal of the second transistor chip to a connection, of the first conductor of the first output signal line, with the first bonding wire is the same direction as a direction from the drain terminal of the second transistor chip to a connection, of the second conductor of the second output signal line, with the second bonding wire.

14 Claims, 11 Drawing Sheets

AMPLIFIER MODULE AND COMMUNICATION DEVICE

TECHNICAL FIELD

The present disclosure relates to an amplifier module and a communication device. This application claims priority on Japanese Patent Application No. 2020-090328 filed on May 25, 2020, the entire content of which is incorporated herein by reference.

BACKGROUND ART

In a Doherty amplifier circuit, power loss occurs if an output signal from a carrier amplifier flows to a peak amplifier side during a back-off operation. From the viewpoint of reducing such power loss, it is ideal that an impedance on the peak amplifier side is open during the back-off operation, on the basis of a coupling point of an output from the carrier amplifier and an output from the peak amplifier. Therefore, a delay line is disposed on the output side of the peak amplifier. However, a long delay line results in an increase in the circuit size.

PATENT LITERATURE 1 discloses a Doherty amplifier in which a drain terminal of a carrier amplifier die is connected to printed wiring by a bonding wire, and a drain terminal of a peak amplifier die is connected to the printed wiring by a bonding wire. In the Doherty amplifier disclosed in PATENT LITERATURE 1, a bonding wire (hereinafter referred to as "first bonding wire") connected to printed wiring (hereinafter referred to as "first conductor") for transmitting an output signal from the carrier amplifier die, and a bonding wire (hereinafter referred to as "second bonding wire") connected to printed wiring (hereinafter referred to as "second conductor") for transmitting a synthetic signal of an output signal from the carrier amplifier die and an output signal from the peak amplifier die, extend from an output terminal (drain terminal) of the peak amplifier die. The first bonding wire extends in a direction orthogonal to a direction (hereinafter referred to as "circuit direction") in which an input terminal and the output terminal (drain terminal) of the peak amplifier die are connected, and the second bonding wire extends in the circuit direction. In the peak amplifier die, in order to extend the first bonding wire in the direction orthogonal to the circuit direction, the drain terminal is bent at a right angle, and an end part thereof extends in the circuit direction. The first bonding wire is connected to the part extending in the circuit direction.

CITATION LIST

Patent Literature

PATENT LITERATURE 1: US Patent Application Publication No. US2018/0175802

SUMMARY OF THE INVENTION

An amplifier module according to one aspect of the present disclosure is an amplifier module including a Doherty amplifier circuit. The Doherty amplifier circuit includes a first transistor chip constituting a carrier amplifier, a first output signal line configured to transmit a first amplified signal outputted from the carrier amplifier, a second transistor chip constituting a peak amplifier, and a second output signal line configured to transmit a synthetic signal of the first amplified signal and a second amplified signal outputted from the peak amplifier. The first output signal line includes a first conductor provided on a printed-circuit board, and a first bonding wire having a first end connected to the first conductor, and a second end connected to a drain terminal of the second transistor chip. The second output signal line includes a second conductor separated from the first conductor on the printed-circuit board, and a second bonding wire having a first end connected to the drain terminal of the second transistor chip, and a second end connected to the second conductor. A direction from the drain terminal of the second transistor chip to a connection, of the first conductor, with the first end of the first bonding wire is the same direction as a direction from the drain terminal of the second transistor chip to a connection, of the second conductor, with the second end of the second bonding wire.

An amplifier module according to another aspect of the present disclosure is an amplifier module including a Doherty amplifier circuit. The Doherty amplifier circuit includes a first transistor chip constituting a carrier amplifier, a first output signal line configured to transmit a first amplified signal outputted from the carrier amplifier, a second transistor chip constituting a peak amplifier, and a second output signal line configured to transmit a synthetic signal of the first amplified signal and a second amplified signal outputted from the peak amplifier. The first output signal line includes a first conductor provided on a printed-circuit board, and a first bonding wire having a first end connected to the first conductor, and a second end connected to a drain terminal of the second transistor chip. The second output signal line includes a second conductor separated from the first conductor on the printed-circuit board, and a second bonding wire having a first end connected to the drain terminal of the second transistor chip, and a second end connected to the second conductor. A direction from a gate terminal to the drain terminal of the second transistor chip is the same direction as a direction from the drain terminal of the second transistor chip to a connection, of the first conductor, with the first end of the first bonding wire.

A communication device according to one aspect of the present disclosure is a communication device including a transmitter circuit configured to output a radio frequency transmission signal, and an amplifier module configured to amplify the transmission signal outputted from the transmitter circuit. The amplifier module includes a Doherty amplifier circuit, and the Doherty amplifier circuit includes a first transistor chip constituting a carrier amplifier, a first output signal line configured to transmit a first amplified signal outputted from the carrier amplifier, a second transistor chip constituting a peak amplifier, and a second output signal line configured to transmit a synthetic signal of the first amplified signal and a second amplified signal outputted from the peak amplifier. The first output signal line includes a first conductor provided on a printed-circuit board, and a first bonding wire having a first end connected to the first conductor, and a second end connected to a drain terminal of the second transistor chip. The second output signal line includes a second conductor separated from the first conductor on the printed-circuit board, and a second bonding wire having a first end connected to the drain terminal of the second transistor chip, and a second end connected to the second conductor. A direction from the drain terminal of the second transistor chip to a connection, of the first conductor, with the first end of the first bonding wire is the same direction as a direction from the drain terminal of the second transistor chip to a connection, of the second conductor, with the second end of the second bonding wire.

A communication device according to another aspect of the present disclosure is a communication device including a transmitter circuit configured to output a radio frequency transmission signal, and an amplifier module configured to amplify the transmission signal outputted from the transmitter circuit. The amplifier module includes a Doherty amplifier circuit, and the Doherty amplifier circuit includes a first transistor chip constituting a carrier amplifier, a first output signal line configured to transmit a first amplified signal outputted from the carrier amplifier, a second transistor chip constituting a peak amplifier, and a second output signal line configured to transmit a synthetic signal of the first amplified signal and a second amplified signal outputted from the peak amplifier. The first output signal line includes a first conductor provided on a printed-circuit board, and a first bonding wire having a first end connected to the first conductor, and a second end connected to a drain terminal of the second transistor chip. The second output signal line includes a second conductor separated from the first conductor on the printed-circuit board, and a second bonding wire having a first end connected to the drain terminal of the second transistor chip, and a second end connected to the second conductor. A direction from a gate terminal to the drain terminal of the second transistor chip is the same direction as a direction from the drain terminal of the second transistor chip to a connection, of the first conductor, with the first end of the first bonding wire.

The present disclosure can be realized not only as an amplifier module including the characteristic configurations as described above, but also as a communication device including the amplifier module, or as a method for manufacturing the amplifier module.

DETAILED DESCRIPTION

Figure 1:
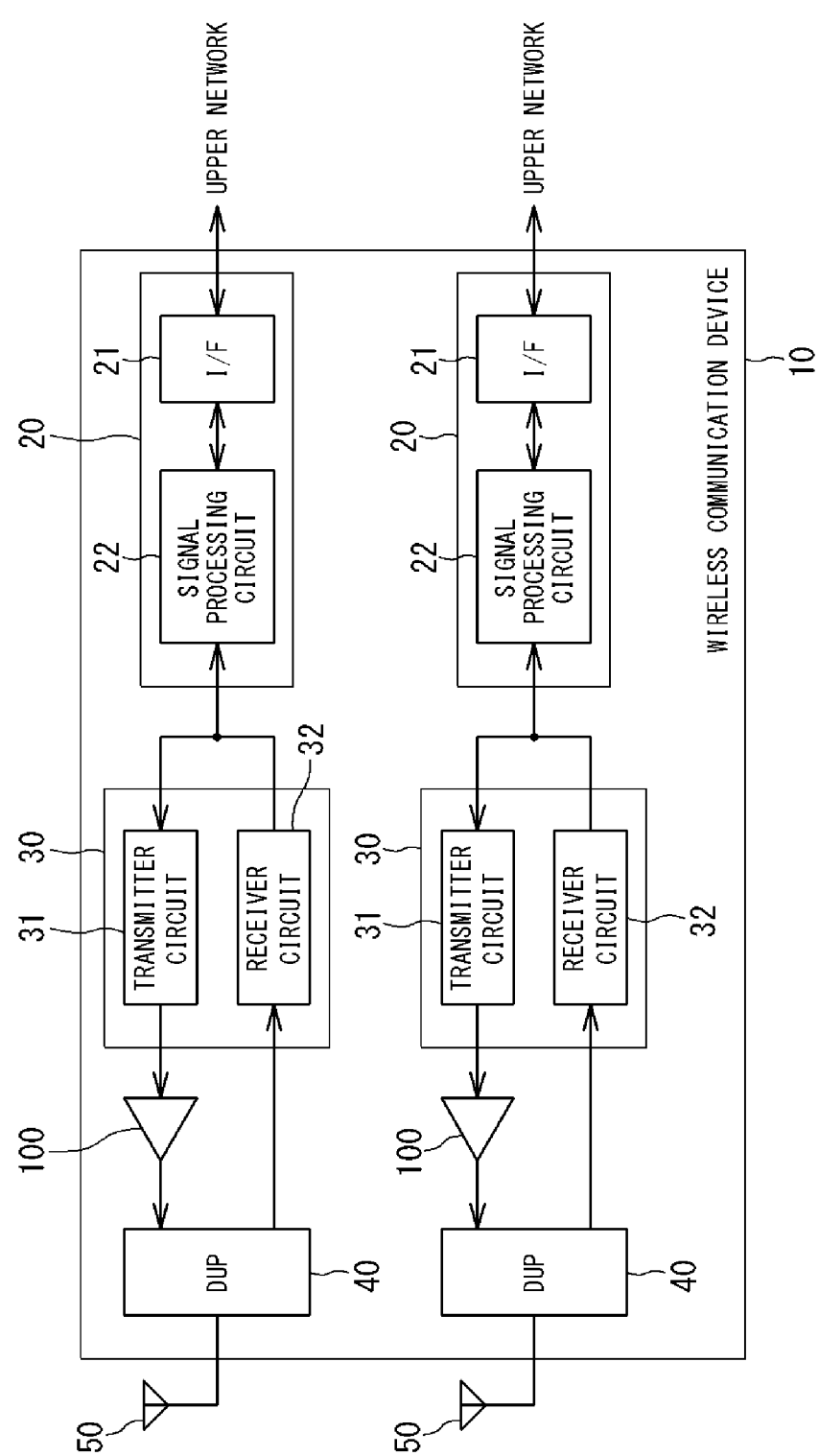
FIG. 1 is a block diagram showing an example of a configuration of a wireless communication device according to a first embodiment.

Problems to be Solved by the Present Disclosure

In the Doherty amplifier disclosed in PATENT LITERATURE 1, the drain terminal of the peak amplifier is bent and extended in the circuit direction. Therefore, the entire length of the drain terminal of the peak amplifier is increased, and a part, of the drain terminal, to which the first bonding wire is connected is apart from a terminal center part that is a start point of transmission of an output signal from the peak amplifier in the drain terminal. Therefore, an impedance on the peak amplifier side is deviated from the open state in the back-off operation. Furthermore, since the drain terminal is bent in the circuit direction in the peak amplifier die, the size of the peak amplifier die is increased. Thus, miniaturization of the entire Doherty amplifier is hindered.

Effects of the Present Disclosure

According to the present disclosure, miniaturization and high efficiency of the Doherty amplifier circuit can be realized.

Outlines of Embodiments of the Present Disclosure

Hereinafter, the outlines of embodiments of the present invention will be listed and described.

(1) An amplifier module according to an embodiment of the present disclosure includes a Doherty amplifier circuit. The Doherty amplifier circuit includes a first transistor chip constituting a carrier amplifier, a first output signal line configured to transmit a first amplified signal outputted from the carrier amplifier, a second transistor chip constituting a peak amplifier, and a second output signal line configured to transmit a synthetic signal of the first amplified signal and a second amplified signal outputted from the peak amplifier. The first output signal line includes a first conductor provided on a printed-circuit board, and a first bonding wire having a first end connected to the first conductor, and a second end connected to a drain terminal of the second transistor chip. The second output signal line includes a second conductor separated from the first conductor on the printed-circuit board, and a second bonding wire having a first end connected to the drain terminal of the second transistor chip, and a second end connected to the second conductor. A direction from the drain terminal of the second transistor chip to a connection, of the first conductor, with the first end of the first bonding wire is the same direction as a direction from the drain terminal of the second transistor chip to a connection, of the second conductor, with the second end of the second bonding wire. The "direction" does not mean "two-way direction" but means "one-way direction". With the above configuration, a coupling point of an output from the carrier amplifier and an output from the peak amplifier becomes the drain terminal of the second transistor. Therefore, wiring from the drain terminal of the second transistor to the coupling point is eliminated, whereby an impedance on the peak amplifier side from the coupling point in a back-off operation can be made close to an open state without providing a delay line. Furthermore, a direction from the drain terminal of the second transistor chip to a connection, of the first conductor, with the first end of the first bonding wire is aligned with a direction from the drain terminal of the second transistor chip to a connection, of the second conductor, with the second end of the second bonding wire. Therefore, the drain terminal of the second transistor chip need not be bent, whereby the impedance on the peak amplifier side from the coupling point in the back-off operation is inhibited from deviating from the open state, and an increase in size of the Doherty amplifier circuit is inhibited.

(2) A direction from a gate terminal to the drain terminal of the second transistor chip may be the same direction as the direction from the drain terminal of the second transistor chip to the connection, of the first conductor, with the first end of the first bonding wire. Therefore, the drain terminal of the second transistor chip need not be bent, whereby the impedance on the peak amplifier side from the coupling point in the back-off operation is inhibited from deviating from the open state, and an increase in size of the Doherty amplifier circuit is inhibited.

(3) The first output signal line may further include a third bonding wire having a first end connected to a drain terminal of the first transistor chip and a second end connected to the first conductor. A direction from the drain terminal of the first transistor chip to a connection, of the first conductor, with the second end of the third bonding wire may be the same as or opposite to the direction from the drain terminal of the second transistor chip to the connection, of the first conductor, with the first end of the first bonding wire. Thus, a manufacturing process is inhibited from being complicated due to wiring directions of the bonding wires being not aligned.

(4) A direction from a gate terminal to the drain terminal of the first transistor chip may be the same direction as the direction from the drain terminal of the first transistor chip to the connection, of the first conductor, with the second end of the third bonding wire. Thus, the drain terminal of the first transistor chip need not be bent, thereby inhibiting an increase in size of the first transistor chip.

(5) The Doherty amplifier circuit may further include a first impedance conversion circuit connected to the drain terminal of the second transistor chip via the first output signal line, and a third output signal line connecting a drain terminal of the first transistor chip to the first impedance conversion circuit. The third output signal line may include a third conductor provided on the printed-circuit board and connected to the first impedance conversion circuit, and a third bonding wire having a first end connected to the drain terminal of the first transistor chip, and a second end connected to the third conductor. A direction from the drain terminal of the first transistor chip to a connection, of the third conductor, with the second end of the third bonding wire may be the same as or opposite to the direction from the drain terminal of the second transistor chip to the connection, of the first conductor, with the first end of the first bonding wire. Thus, a manufacturing process is inhibited from being complicated due to wiring directions of the bonding wires being not aligned.

(6) The direction from the gate terminal to the drain terminal of the first transistor chip may be the same direction as the direction from the drain terminal of the first transistor chip to the connection, of the third conductor, with the second end of the third bonding wire. Thus, the drain terminal of the first transistor chip need not be bent, thereby inhibiting an increase in size of the first transistor chip.

(7) The first transistor chip and the second transistor chip may be disposed along a direction that intersects with the direction from the drain terminal of the second transistor chip to the connection, of the first conductor, with the first end of the first bonding wire. The direction from the gate terminal to the drain terminal of the first transistor chip may be the same direction as the direction from the gate terminal to the drain terminal of the second transistor chip. Thus, the components of the Doherty amplifier circuit can be efficiently arranged, thereby inhibiting an increase in size of the Doherty amplifier circuit.

(8) The first transistor chip and the second transistor chip may be disposed along the direction from the drain terminal of the second transistor chip to the connection, of the first conductor, with the first end of the first bonding wire. The direction from the gate terminal to the drain terminal of the first transistor chip may be a direction opposite to a direction from a gate terminal to the drain terminal of the second transistor chip. Thus, the components of the Doherty amplifier circuit can be efficiently arranged, thereby inhibiting an increase in size of the Doherty amplifier circuit.

(9) The first conductor may be disposed between the first transistor chip and the second transistor chip. Thus, the components of the Doherty amplifier circuit can be more efficiently arranged, thereby inhibiting an increase in size of the Doherty amplifier circuit.

(10) The Doherty amplifier circuit may further include a second impedance conversion circuit connected to the drain terminal of the second transistor chip via the second output signal line. Thus, a load impedance of the entire Doherty amplifier circuit can be adjusted, thereby further enhancing the efficiency.

(11) The first bonding wire and the second bonding wire may not necessarily intersect with each other. Thus, wiring for connecting the output signal line to the drain terminal of the second transistor can be simplified.

(12) The first bonding wire and the second bonding wire may be parallel to each other. Thus, wiring for connecting the output signal line to the drain terminal of the second transistor can be easily constructed.

(13) The first bonding wire and the second bonding wire may intersect with each other. Thus, the degree of freedom in wiring for connecting the output signal line to the drain terminal of the second transistor can be increased.

(14) An amplifier module according to the present embodiment is an amplifier module including a Doherty amplifier circuit. The Doherty amplifier circuit includes a first transistor chip constituting a carrier amplifier, a first output signal line configured to transmit a first amplified signal outputted from the carrier amplifier, a second transistor chip constituting a peak amplifier, and a second output signal line configured to transmit a synthetic signal of the first amplified signal and a second amplified signal outputted from the peak amplifier. The first output signal line includes a first conductor provided on a printed-circuit board, and a first bonding wire having a first end connected to the first conductor, and a second end connected to a drain terminal of the second transistor chip. The second output signal line includes a second conductor separated from the first conductor on the printed-circuit board, and a second bonding wire having a first end connected to the drain terminal of the second transistor chip, and a second end connected to the second conductor. A direction from a gate terminal to the drain terminal of the second transistor chip is the same direction as the direction from the drain terminal of the second transistor chip to a connection, of the first conductor, with the first end of the first bonding wire. Thus, a coupling point of an output from the carrier amplifier and an output from the peak amplifier becomes the drain terminal of the second transistor. Therefore, wiring from the drain terminal of the second transistor to the coupling point is eliminated, whereby an impedance on the peak amplifier side from the coupling point in a back-off operation can be made close to an open state without providing a delay line. Furthermore, a direction from a gate terminal to the drain terminal of the second transistor chip is aligned with a direction from the drain terminal of the second transistor chip to a connection, of the first conductor, with the first end of the first bonding wire. Therefore, the drain terminal of the second transistor chip need not be bent, whereby the impedance on the peak amplifier side from the coupling point in the back-off operation is inhibited from deviating from the open state, and an increase in size of the Doherty amplifier circuit is inhibited.

(15) A communication device according to the present embodiment is a communication device including a transmitter circuit configured to output a radio frequency transmission signal, and an amplifier module configured to amplify the transmission signal outputted from the transmitter circuit. The amplifier module includes a Doherty amplifier circuit, and the Doherty amplifier circuit includes a first transistor chip constituting a carrier amplifier, a first output signal line configured to transmit a first amplified signal outputted from the carrier amplifier, a second transistor chip constituting a peak amplifier, and a second output signal line configured to transmit a synthetic signal of the first amplified signal and a second amplified signal outputted from the peak amplifier. The first output signal line includes a first conductor provided on a printed-circuit board, and a first bonding wire having a first end connected to the first conductor, and a second end connected to a drain terminal of the second transistor chip. The second output signal line includes a second conductor separated from the first conductor on the printed-circuit board, and a second bonding wire having a first end connected to the drain terminal of the second transistor chip, and a second end connected to the second conductor. A direction from the drain terminal of the second transistor chip to a connection, of the first conductor, with the first end of the first bonding wire is the same direction as a direction from the drain terminal of the second transistor chip to a connection, of the second conductor, with the second end of the second bonding wire. Thus, a coupling point of an output from the carrier amplifier and an output from the peak amplifier becomes the drain terminal of the second transistor. Therefore, wiring from the drain terminal of the second transistor to the coupling point is eliminated, whereby an impedance on the peak amplifier side from the coupling point in a back-off operation can be made close to an open state without providing a delay line. Furthermore, a direction from the drain terminal of the second transistor chip to a connection, of the first conductor, with the first end of the first bonding wire is aligned with a direction from the drain terminal of the second transistor chip to a connection, of the second conductor, with the second end of the second bonding wire. Therefore, the drain terminal of the second transistor chip need not be bent, whereby the impedance on the peak amplifier side from the coupling point in the back-off operation is inhibited from deviating from the open state, and an increase in size of the Doherty amplifier circuit is inhibited.

(16) A communication device according to the present embodiment is a communication device including a transmitter circuit configured to output a radio frequency transmission signal, and an amplifier module configured to amplify the transmission signal outputted from the transmitter circuit. The amplifier module includes a Doherty amplifier circuit, and the Doherty amplifier circuit includes a first transistor chip constituting a carrier amplifier, a first output signal line configured to transmit a first amplified signal outputted from the carrier amplifier, a second transistor chip constituting a peak amplifier, and a second output signal line configured to transmit a synthetic signal of the first amplified signal and a second amplified signal outputted from the peak amplifier. The first output signal line includes a first conductor provided on a printed-circuit board, and a first bonding wire having a first end connected to the first conductor, and a second end connected to a drain terminal of the second transistor chip. The second output signal line includes a second conductor separated from the first conductor on the printed-circuit board, and a second bonding wire having a first end connected to the drain terminal of the second transistor chip, and a second end connected to the second conductor. A direction from a gate terminal to the drain terminal of the second transistor chip is the same direction as the direction from the drain terminal of the second transistor chip to a connection, of the first conductor, with the first end of the first bonding wire. Thus, a coupling point of an output from the carrier amplifier and an output from the peak amplifier becomes the drain terminal of the second transistor. Therefore, wiring from the drain terminal of the second transistor to the coupling point is eliminated, whereby an impedance on the peak amplifier side from the coupling point in a back-off operation can be made close to an open state without providing a delay line. Furthermore, a direction from a gate terminal to the drain terminal of the second transistor chip is aligned with a direction from the drain terminal of the second transistor chip to a connection, of the first conductor, with the first end of the first bonding wire. Therefore, the drain terminal of the second transistor chip need not be bent, whereby the impedance on the peak amplifier side from the coupling point in the back-off operation is inhibited from deviating from the open state, and an increase in size of the Doherty amplifier circuit is inhibited.

DETAILS OF EMBODIMENTS OF THE PRESENT DISCLOSURE

Hereinafter, embodiments of the present disclosure will be described in detail with reference to the drawings. At least some parts of the embodiments described below may be combined as desired.

First Embodiment

[1-1. Wireless Communication Device]

FIG. 1 is a block diagram showing an example of a configuration of a wireless communication device according to the present embodiment. A wireless communication device 10 is a base station device for mobile communication, for example. The wireless communication device 10 includes base band units (hereinafter also referred to as BBU) 20, remote radio heads (hereinafter also referred to as RRH) 30, amplifier circuits 100, duplexers 40, and antennae 50. In the shown example, the wireless communication device 10 includes a plurality of communication systems each including a BBU 20, an RRH 30, an amplifier circuit 100, a duplexer 40, and an antenna 50. However, the wireless communication device 10 is not limited thereto, and may include one communication system described above.

The RRH 30 performs a process of transmitting and receiving, as a radio signal, transmission/reception data to and from a mobile terminal device connected to the wireless communication device 10. The BBU 20 performs digital signal processing and the like for the transmission/reception data to be transmitted and received by the RRH 30. The RRH 30 and the BBU 20 are connected to each other by a circuit using a transmission path such as an optical fiber. In the shown example, one RRH 30 is connected to one BBU 20. However, a plurality of RRHs 30 may be connected to one BBU 20.

The RRH 30 includes a transmitter circuit 31 and a receiver circuit 32. The transmitter circuit 31 performs quadrature modulation on transmission data that is given as a digital baseband signal from the BBU 20. The amplifier circuit 100 is connected to the transmitter circuit 31. The transmitter circuit 31 converts the transmission data into an analog radio signal, and outputs the radio signal to the amplifier circuit 100.

The amplifier circuit 100 amplifies the radio signal (transmission signal). The amplified transmission signal is outputted to the duplexer 40. The duplexer 40 separates the transmission signal from a reception signal, and outputs the transmission signal to the antenna 50. The transmission signal outputted from the duplexer 40 is transmitted through the antenna 50.

A radio signal (reception signal), from the mobile terminal device, received by the antenna 50 is inputted to the duplexer 40. The duplexer 40 separates the reception signal from the transmission signal, and outputs the reception signal to the receiver circuit 32.

The receiver circuit 32 amplifies the received reception signal, and performs AD (analog-digital) conversion on the amplified reception signal. The receiver circuit 32 performs quadrature demodulation on the digital reception signal (reception data), and outputs the quadrature-demodulated reception data as a baseband signal.

The BBU 20 includes an interface unit 21 and a signal processing circuit 22. The signal processing circuit 22 is connected to an upper network via the interface unit 21, and exchanges an IP packet with the upper network. Furthermore, the signal processing circuit 22 performs a process of exchanging the IP packet and the baseband signal.

[1-2. Amplifier Circuit]

Next, the amplifier circuit 100 will be described. The amplifier circuit 100 is an example of the amplifier module.

Figure 2:
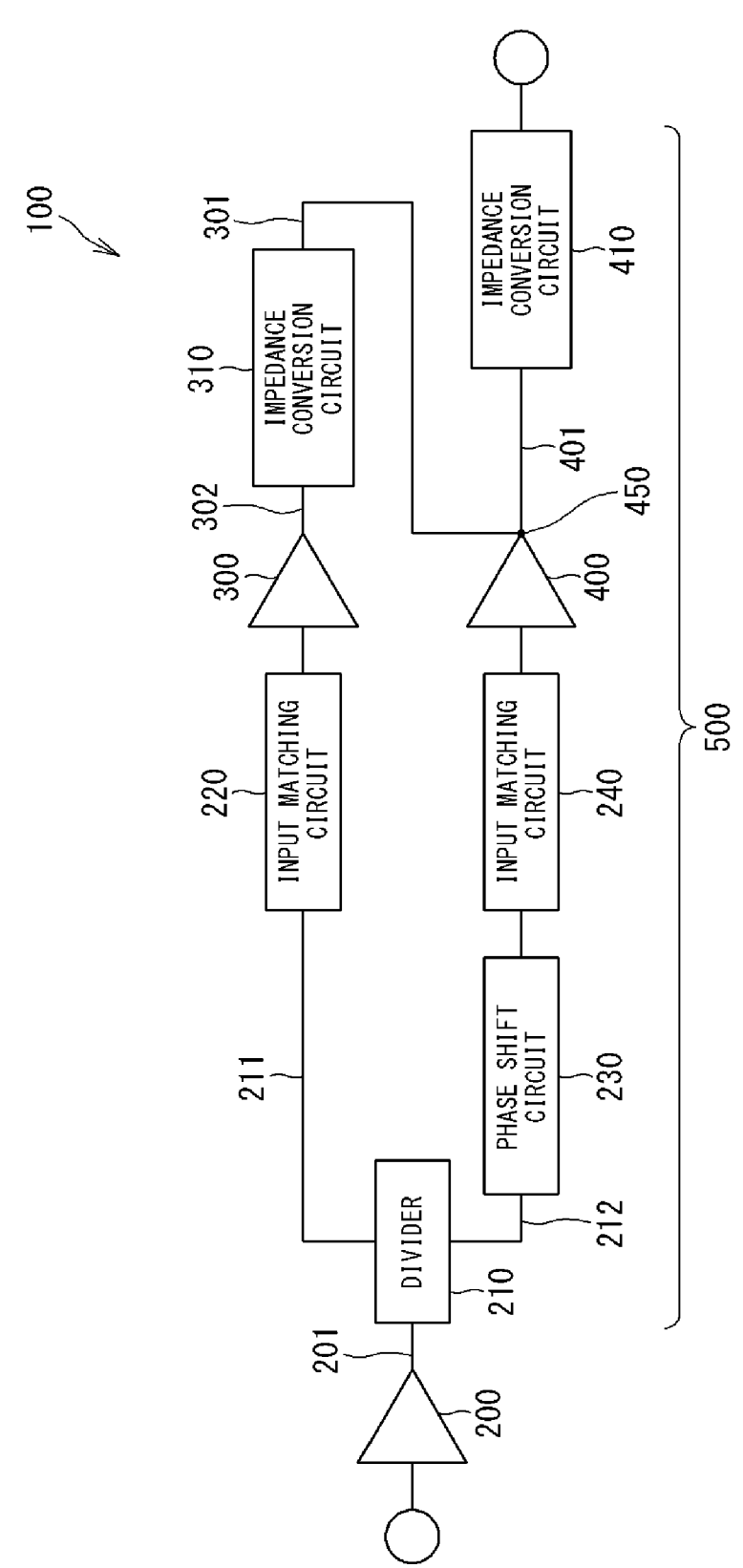
FIG. 2 is a block diagram showing an example of a configuration of an amplifier circuit according to the first embodiment.

FIG. 2 is a block diagram showing an example of a configuration of the amplifier circuit according to the present embodiment. The amplifier circuit 100 shown in FIG. 2 includes a driver amplifier 200 and a Doherty amplifier circuit 500. The Doherty amplifier circuit 500 includes a divider 210, input matching circuits 220, 240, a phase shift circuit 230, a carrier amplifier 300, an impedance conversion circuit 310, a peak amplifier 400, and an impedance conversion circuit 410.

The driver amplifier 200, the carrier amplifier 300, and the peak amplifier 400 are each composed of a transistor chip such as a MOSFET (Metal-Oxide-Semiconductor Field-Effect Transistor), an IGBT (Insulated Gate Bipolar Transistor), a GaN HEMT (Gallium Nitride High-Electron-Mobility Transistor), or the like. The driver amplifier 200, the carrier amplifier 300, and the peak amplifier 400 may be composed of transistor chips having the same configuration, material, and characteristics, or may be composed of transistor chips that are different in at least one of configuration, material, and characteristics.

In the amplifier circuit 100, the driver amplifier 200 is a preamplifier, and an input side of the Doherty amplifier circuit 500 is connected to an output terminal (drain terminal) of the driver amplifier 200. More specifically, a signal line 201 extending from the output terminal of the driver amplifier 200 is connected to the input side of the Doherty amplifier circuit 500.

The Doherty amplifier circuit 500 includes the divider 210. The signal line 201 is connected to an input terminal of the divider 210. Signal lines 211, 212 extend from two output terminals of the divider 210, respectively. The driver amplifier 200 amplifies a high frequency signal outputted from the transmitter circuit 31, and outputs the amplified signal. The divider 210 distributes the high frequency signal outputted from the driver amplifier 200 to the signal lines 211 and 212.

The signal line 211 is connected to an input terminal (gate terminal) of the carrier amplifier 300 via the input matching circuit 220. The carrier amplifier 300 is biased in class A or class AB, amplifies an input signal regardless of the power level of the signal, and outputs the amplified signal (first amplified signal).

The signal line 212 is connected to an input terminal (gate terminal) of the peak amplifier 400 via the phase shift circuit 230 and the input matching circuit 240. The phase shift circuit 230 imparts a phase delay of 90° to an input signal. The peak amplifier 400 is biased in class C, amplifies an input signal when the power level of the signal is equal to or higher than a predetermined value, and outputs the amplified signal (second amplified signal).

An output terminal (drain terminal) of the carrier amplifier 300 is connected to the impedance conversion circuit 310 via an output signal line (third output signal line) 302. An output signal line (first output signal line) 301 extends from the impedance conversion circuit 310. The impedance conversion circuit 310 imparts a phase delay of 90° to an input signal. The impedance conversion circuit 310 adjusts a load impedance of the carrier amplifier 300. The output signal lines 302, 301 transmit the first amplified signal outputted from the carrier amplifier 300. The output signal line 301 is connected to an output terminal (drain terminal) of the peak amplifier 400. In other words, a coupling point of the output from the carrier amplifier 300 and the output from the peak amplifier 400 is an output terminal 450 of the peak amplifier 400. That is, the output terminal of the carrier amplifier 300 is connected to the output terminal of the peak amplifier 400 via the impedance conversion circuit 310.

An output signal line (second output signal line) 401 is connected to the output terminal of the peak amplifier 400. The output signal line 401 transmits a synthetic signal of the amplified signal (first amplified signal) outputted from the carrier amplifier 300 and the amplified signal (second amplified signal) outputted from the peak amplifier 400. The output signal line 401 is connected to the impedance conversion circuit 410. The impedance conversion circuit 410 adjusts the impedance of the entire Doherty amplifier circuit 500.

If the power level of an input signal from the driver amplifier 200 is low, the Doherty amplifier circuit 500 having the above configuration amplifies the signal by using the carrier amplifier 300 and outputs the amplified signal. If the power level of the input signal from the driver amplifier 200 is high, the Doherty amplifier circuit 500 amplifies the signal by using each of the carrier amplifier 300 and the peak amplifier 400, and synthesizes two amplified signals to output a synthetic signal. The output signal from the Doherty amplifier circuit 500 is inputted to the duplexer 40.

[1-3. Signal Line Connection Structure at Output Terminal of Peak Amplifier]

Figure 3A:
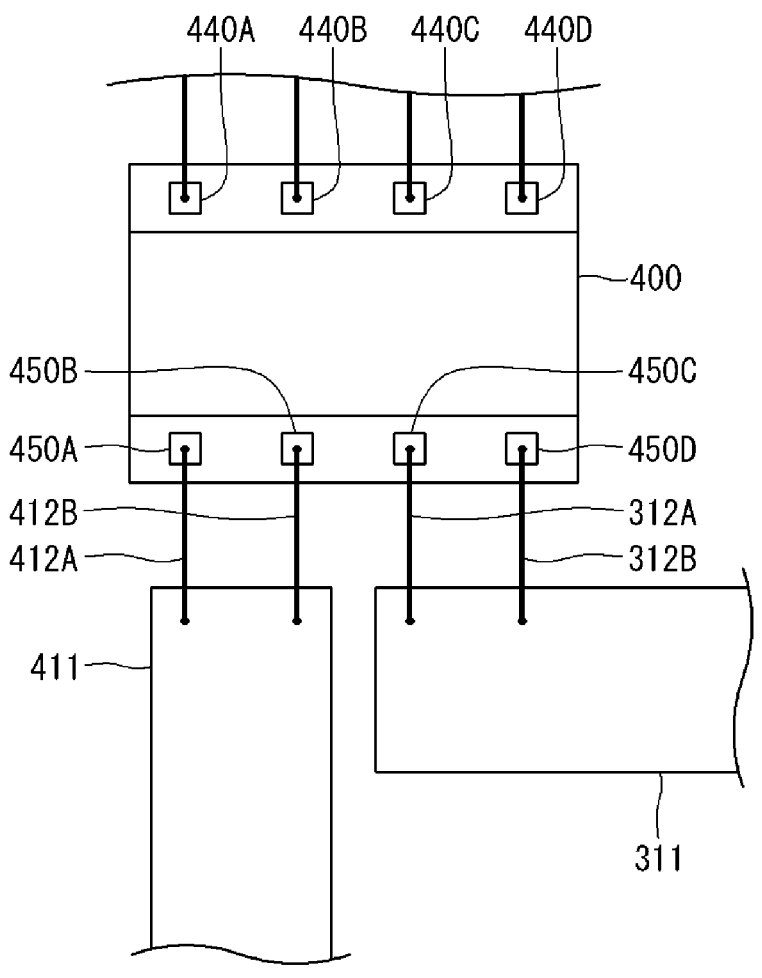
FIG. 3A is a plan view showing an example of a signal line connection structure at an output terminal of a peak amplifier according to the first embodiment.

FIG. 3A is a plan view showing an example of a signal line connection structure at the output terminal of the peak amplifier according to the present embodiment. The afore-mentioned Doherty amplifier circuit 500 is mounted on a printed-circuit board. The output signal line 301 includes a microstrip line 311 (first conductor) printed on the printed-circuit board, and bonding wires (first bonding wires) 312A, 312B. Likewise, the output signal line 401 includes a microstrip line (second conductor) 411 printed on the printed-circuit board, and bonding wires (second bonding wires) 412A, 412B. The conductors are not limited to the microstrip lines, and any conductor may be used as long as it is provided on a printed-circuit board that allows wire bonding. For example, a strip line having a part exposed from a printed-circuit board may be used.

The peak amplifier 400 as a transistor chip includes connections 440A, 440B, 440C, 440D of the input terminal (gate terminal), and connections 450A, 450B, 450C, 450D of the output terminal (drain terminal). The connections 440A, 440B, 440C, 440D are connection parts of leads at one input terminal, and the connections 440A, 440B, 440C, 440D are conductive with each other. The connections 450A, 450B, 450C, 450D are connection parts of leads at one output terminal, and the connections 450A, 450B, 450C, 450D are conductive with each other.

The microstrip line 311 and the microstrip line 411 are separated from each other. The microstrip line 311 is con-nected to the connections 450C, 450D by the bonding wires 312A, 312B. That is, one end of the bonding wire 312A is bonded to the microstrip line 311, and the other end of the bonding wire 312A is bonded to the connection 450C. One end of the bonding wire 312B is bonded to the microstrip line 311, and the other end of the bonding wire 312B is bonded to the connection 450D. Thus, connection between the output signal line 301 and the output terminal of the peak amplifier 400 is realized.

The microstrip line 411 is connected to the connections 450A, 450B by the bonding wires 412A, 412B. That is, one end of the bonding wire 412A is bonded to the microstrip line 411, and the other end of the bonding wire 412A is bonded to the connection 450A. One end of the bonding wire 412B is bonded to the microstrip line 411, and the other end of the bonding wire 412B is bonded to the connection 450B. Thus, connection between the output signal line 401 and the output terminal of the peak amplifier 400 is realized.

In the example shown in FIG. 3A, the bonding wires 312A, 312B, 412A, 412B do not intersect with each other. For example, the bonding wires 312A, 312B, 412A, 412B are parallel to each other. This facilitates the wire bonding process. That is, wiring for connecting the output signal line 301 to the output terminal of the peak amplifier (second transistor) 400 is simplified.

In the example shown in FIG. 3A, the microstrip line 311 is disposed at a position close to the connections 450C and 450D of the peak amplifier 400, and the microstrip line 411 is disposed at a position close to the connections 450A, 450B of the peak amplifier 400. The bonding wires 312A and 312B extending from the microstrip line 311 are con-nected to the connections 450C and 450D close to the microstrip line 311. The bonding wires 412A and 412B extending from the microstrip line 411 are connected to the connections 450A and 450B close to the microstrip line 411.

In the example shown in FIG. 3A, the bonding wires 312A, 312B included in the output signal line 301 (i.e., for output of the carrier amplifier 300) are disposed adjacent to each other, and the bonding wires 412A, 412B included in the output signal line 401 (i.e., for output of the synthetic signal obtained by synthesizing the output signal of the carrier amplifier 300 and the output signal of the peak amplifier 400) are disposed adjacent to each other. However, FIG. 3A merely shows an example of arrangement of the bonding wires 312A, 312B, 412A, 412B, and the present disclosure is not limited thereto.

Figure 3B:
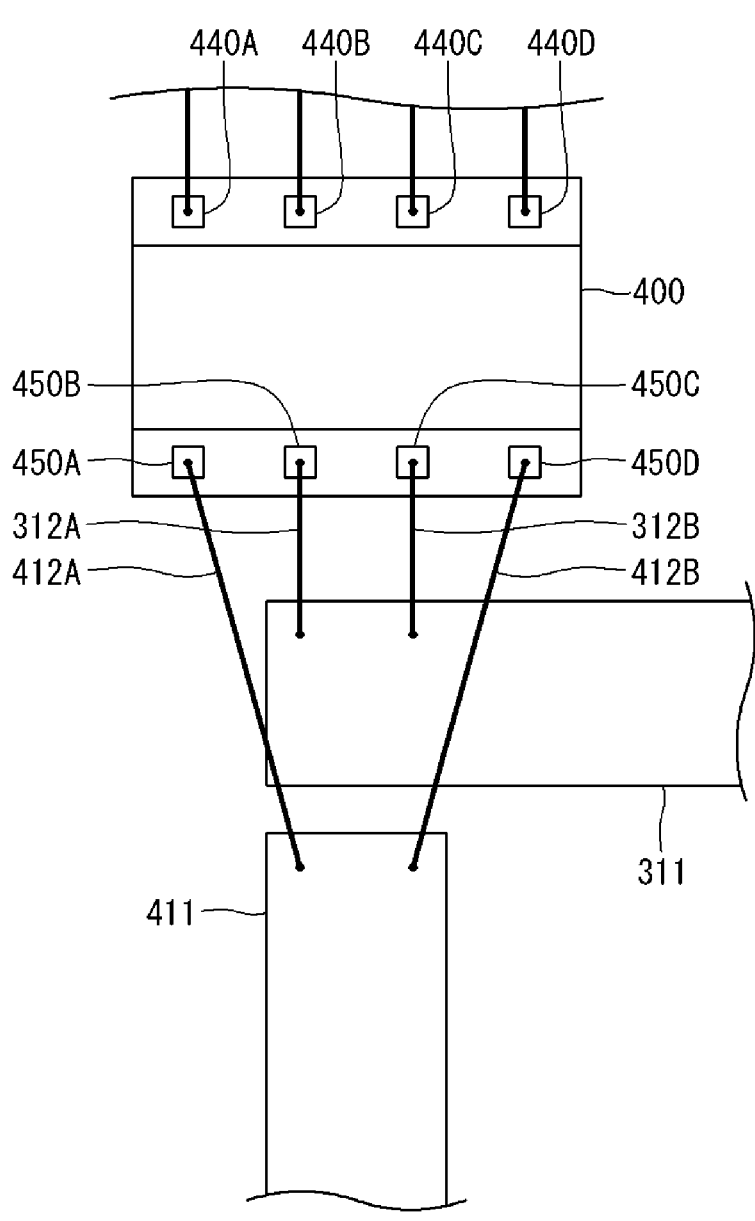
FIG. 3B is a plan view showing another example of the signal line connection structure at the output terminal of the peak amplifier according to the first embodiment.

FIG. 3B is a plan view showing another example of the signal line connection structure at the output terminal of the peak amplifier according to the present embodiment. In this example, the bonding wire 312A is connected to the con-nection 450B, and the bonding wire 312B is connected to the connection 450C. Further, the bonding wire 412A is con-nected to the connection 450A, and the bonding wire 412B is connected to the connection 450D.

In the example shown in FIG. 3B, the bonding wires 312A, 312B included in the output signal line 301 are disposed adjacent to each other, but the bonding wires 412A, 412B included in the output signal line 401 are not adjacent to each other. The bonding wires 312A, 312B are interposed between the bonding wires 412A and 412B. Even in this connection form, the bonding wires 312A, 312B, 412A, 412B do not intersect with each other. This facilitates the wire bonding process. Although the bonding wires 312A, 312B, 412A, 412B are not parallel to each other in FIG. 3B, the bonding wires 312A, 312B, 412A, 412B may be parallel to each other.

In the example shown in FIG. 3B, a space is provided between the peak amplifier 400 and the microstrip line 411, and the microstrip line 311 is disposed in this space. That is, the microstrip line 311 is interposed between the peak amplifier 400 and the microstrip line 411. Each of the bonding wires 412A and 412B connects the peak amplifier 400 and the microstrip line 411 across the microstrip line 311. Thus, the peak amplifier 400 and one of the microstrip lines 311, 411 may be disposed apart from each other, and the other of the microstrip lines 311, 411 may be interposed therebetween. Furthermore, either the bonding wires 312A, 312B or the bonding wires 412A, 412B may be extended across the other microstrip line.

Although not shown in FIG. 3B, the bonding wires 412A, 412B may be interposed between the bonding wires 312A and 312B. That is, for example, the bonding wire 312A may be connected to the connection 450A, the bonding wire 312B may be connected to the connection 450D, the bond-ing wire 412A may be connected to the connection 450B, and the bonding wire 412B may be connected to the con-nection 450C. Furthermore, the bonding wires 312A, 312B for output of the carrier amplifier 300 and the bonding wires 412A, 412B for output of the synthetic signal may be alternately disposed. That is, for example, the bonding wire 312A may be connected to the connection 450A, the bond-ing wire 412A may be connected to the connection 450B, the bonding wire 312B may be connected to the connection 450C, and the bonding wire 412B may be connected to the connection 450D.

Figure 3C:
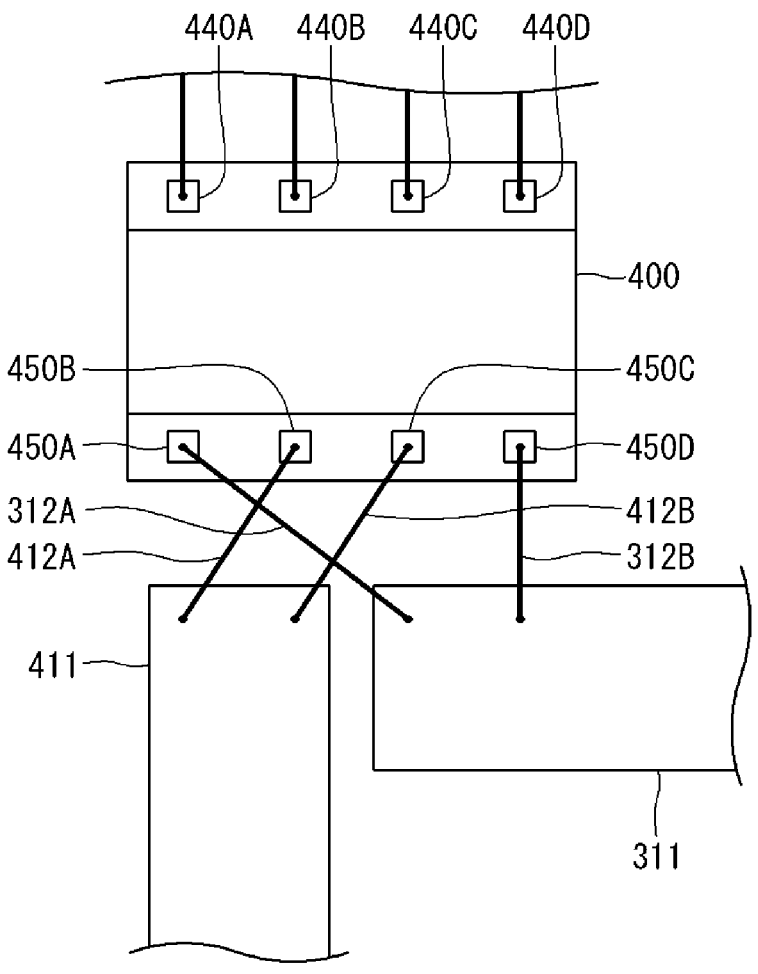
FIG. 3C is a plan view showing still another example of the signal line connection structure at the output terminal of the peak amplifier according to the first embodiment.

FIG. 3C is a plan view showing still another example of the connection structure of the signal line at the output terminal of the peak amplifier according to the present embodiment. In this example, the bonding wire 312A is connected to the connection 450A, and the bonding wire 312B is connected to the connection 450D. Furthermore, the bonding wire 412A is connected to the connection 450B, and the bonding wire 412B is connected to the connection 450C. The bonding wire 312A intersects with the bonding wires 412A and 412B in a plan view. However, three-dimensionally, the bonding wire 312A is not in contact with the bonding wires 412A and 412B. That is, the bonding wire 312A is separated from the bonding wires 412A and 412B in an up-down direction.

As shown in FIG. 3C, at least some of the bonding wires 312A, 312B, 412A, 412B may intersect with each other. Thus, the degree of freedom in wiring is increased. Although not shown in FIG. 3C, the bonding wires 312A and 312B may intersect with the bonding wires 412A and 412B.

[1-4. Impedance on Peak Amplifier Side from Coupling Point in Back-Off Operation]

Figure 4A:
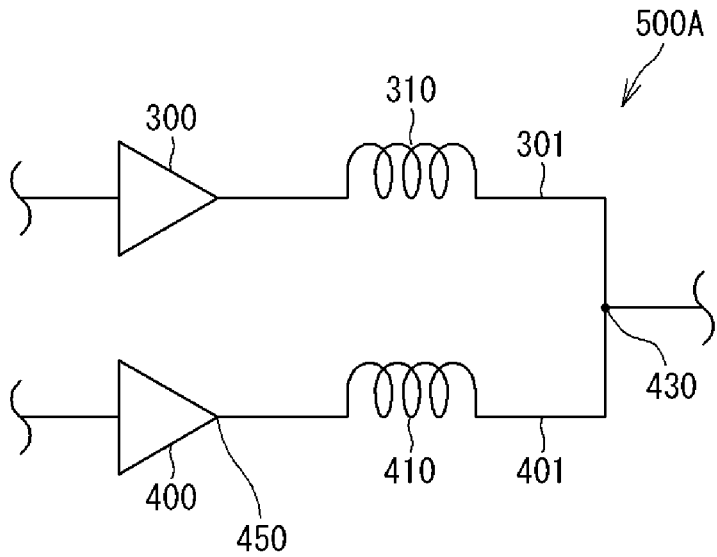
FIG. 4A is a circuit diagram showing a coupling point of an output of a carrier amplifier and an output of a peak amplifier, in a conventional Doherty amplifier circuit.
Figure 4B:
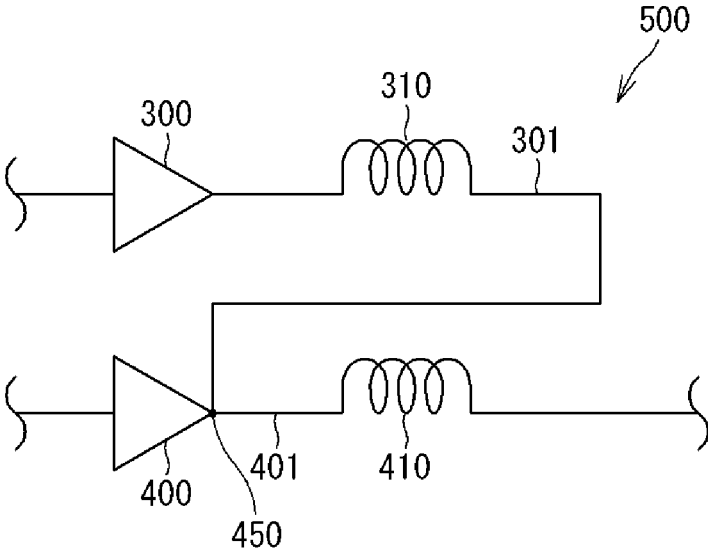
FIG. 4B is a circuit diagram showing a coupling point of an output of a carrier amplifier and an output of the peak amplifier, in the Doherty amplifier circuit according to the first embodiment.

FIG. 4A is a circuit diagram showing a coupling point of an output from a carrier amplifier and an output from a peak amplifier in a conventional Doherty amplifier circuit. FIG. 4B is a circuit diagram showing a coupling point of an output from the carrier amplifier and an output from the peak amplifier in the Doherty amplifier circuit according to the present embodiment.

In a Doherty amplifier circuit 500A shown in FIG. 4A, the impedance conversion circuit 410 is disposed on the output side of the peak amplifier 400. The output signal line 301 extending from the impedance conversion circuit 310 disposed on the output side of the carrier amplifier 300 and the output signal line 401 extending from the impedance conversion circuit 410 are connected to each other at a coupling point 430. The output signal line 401 and the impedance conversion circuit 410 are included between the output terminal of the peak amplifier 400 and the coupling point 430. However, the impedance conversion circuit 310 shown in FIG. 4A has the same configuration as the impedance conversion circuit of the present embodiment, and does not include a delay line.

In the Doherty amplifier circuit 500 according to the present embodiment, the impedance conversion circuit 310 is disposed on the output side of the carrier amplifier 300. The output signal line 301 extending from the impedance conversion circuit 310 is connected to the output terminal 450 of the peak amplifier 400. The output signal line 401 extends from the output terminal of the peak amplifier 400, and the output signal line 401 is connected to the impedance conversion circuit 410. In the Doherty amplifier circuit 500 according to the present embodiment, a coupling point of an output from the carrier amplifier 300 and an output from the peak amplifier 400 is the output terminal 450 of the peak amplifier 400.

Figure 5:
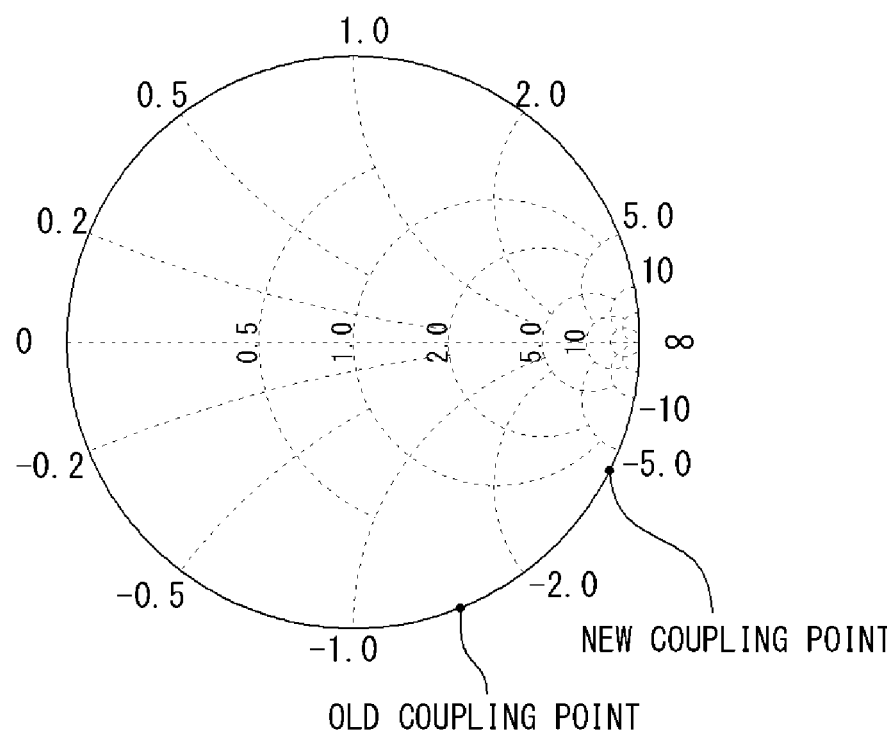
FIG. 5 is a graph showing an impedance on the peak amplifier side from the coupling point in a back-off operation.

FIG. 5 is a graph (Smith chart) showing an impedance on the peak amplifier side from the coupling point in the back-off operation. In FIG. 5, "old coupling point" indicates an impedance on the peak amplifier side in the back-off operation as viewed from the coupling point 430 shown in FIG. 4A, and "new coupling point" indicates an impedance on the peak amplifier side from the coupling point in the back-off operation in the Doherty amplifier circuit 500 according to the present embodiment.

When a delay line is not disposed on the output side of the carrier amplifier 300, the impedance on the peak amplifier 400 side as viewed from the coupling point in the back-off operation is an impedance from the output terminal 450 of the peak amplifier 400 to the coupling point. Therefore, in the Doherty amplifier circuit 500A shown in FIG. 4A, the impedance on the peak amplifier 400 side from the coupling point 430 in the back-off operation includes an impedance that is determined by physical properties of the impedance conversion circuit 410 and the output signal line 401.

Therefore, the impedance on the peak amplifier 400 side from the coupling point 430 in the back-off operation is at the position of the "old coupling point" that is apart from the "open" position (indicated by "∞" in FIG. 5).

Meanwhile, in the Doherty amplifier circuit 500 according to the present embodiment, the coupling point is the output terminal 450 of the peak amplifier 400. Therefore, the impedance on the peak amplifier 400 side from the coupling point in the back-off operation does not include the impedance determined by the physical properties of the impedance conversion circuit 450 and the output signal line 401. Therefore, the impedance on the peak amplifier 400 side from the coupling point in the back-off operation is at the position of the "new coupling point", and approaches the "open" state that is an ideal impedance.

2. Second Embodiment

Figure 6:
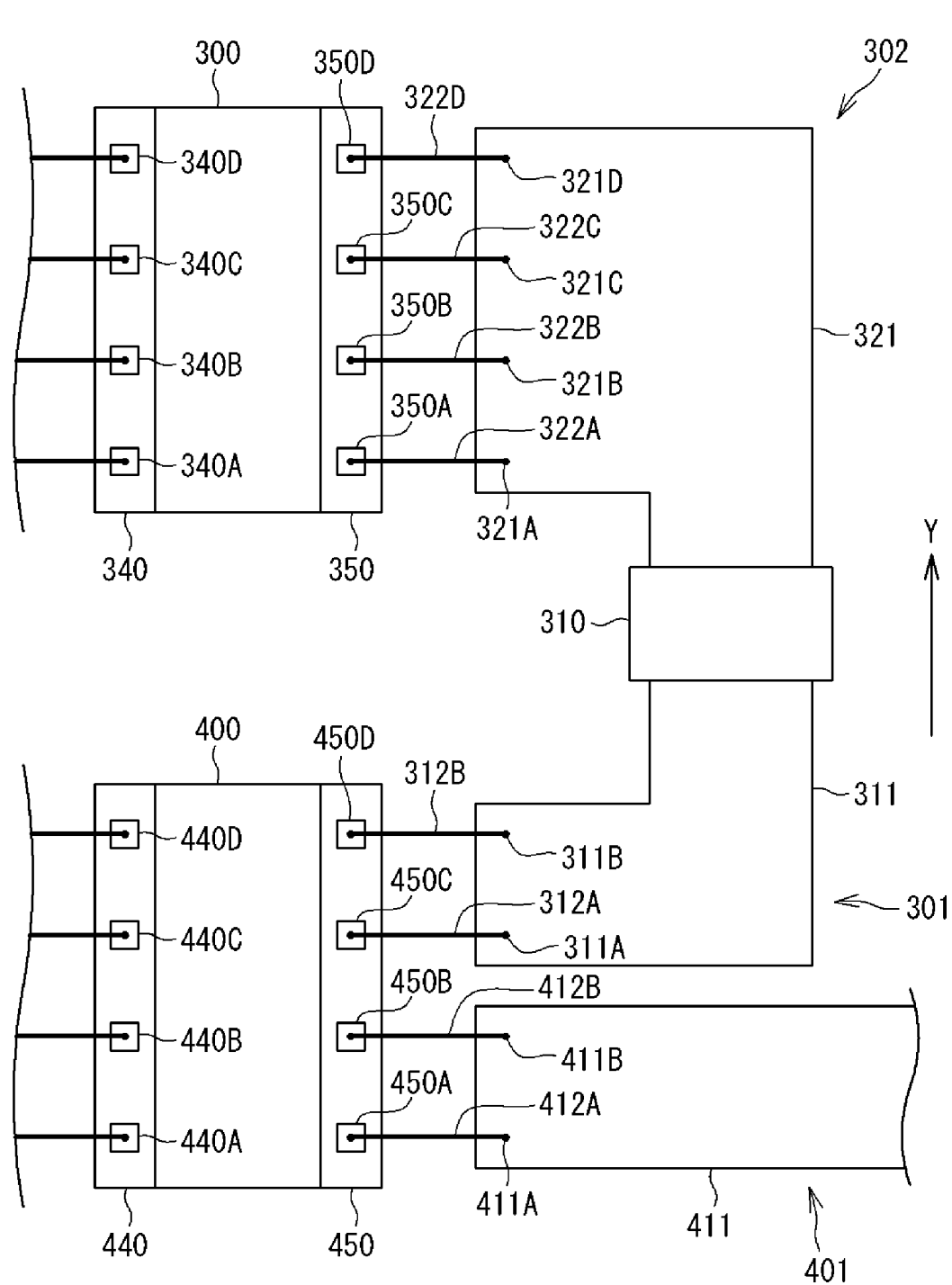
FIG. 6 is a plan view showing connection structures of signal lines in a carrier amplifier and a peak amplifier according to a second embodiment.

FIG. 6 is a plan view showing signal line connection structures in a carrier amplifier and a peak amplifier according to a second embodiment. In FIG. 6, an X1 direction and an X2 direction are directions opposite to each other. In FIG. 6, both the X1 direction and the X2 direction indicate the horizontal direction. In FIG. 6, the X1 direction is a leftward direction and the X2 direction is a rightward direction. The X1 direction and the X2 direction are opposite to each other. AY direction is a direction orthogonal to the X1 and X2 directions.

The carrier amplifier 300 and the peak amplifier 400 are disposed along the Y direction. The carrier amplifier 300 is disposed such that the direction from the gate terminal 340 to the drain terminal 350 is the X2 direction. The peak amplifier 400 is disposed such that the direction from the gate terminal 440 to the drain terminal 450 is the X2 direction. That is, the direction from the gate terminal 340 to the drain terminal 350 of the carrier amplifier 300 is the same direction as the direction from the gate terminal 440 to the drain terminal 450 of the peak amplifier 400.

On the output side (i.e., a side in the X2 direction) of the carrier amplifier 300, the output signal line 302 is disposed. The output signal line 302 includes a microstrip line 321 (third conductor) printed on the printed-circuit board, and bonding wires (third bonding wires) 322A, 322B, 322C, 322D. However, the conductors are not limited to microstrip lines, and any conductor may be used as long as it is provided on a printed-circuit board that allows wire bonding. For example, a strip line having a part exposed from a printed-circuit board may be used.

The carrier amplifier 300 as a transistor chip includes connections 340A, 340B, 340C, 340D of the input terminal (gate terminal 340), and connections 350A, 350B, 350C, 350D of the output terminal (drain terminal 350). The connections 340A, 340B, 340C, 340D are connection parts of leads at one input terminal, and the connections 340A, 340B, 340C, 340D are conductive with each other. The connections 350A, 350B, 350C, 350D are connection parts of leads at one output terminal, and the connections 350A, 350B, 350C, 350D are conductive with each other.

The microstrip line 321 is connected to an input terminal (not shown) of the impedance conversion circuit 310. The microstrip line 321 is connected to the connections 350A, 350B, 350C, 350D by the bonding wires 322A, 322B, 322C, 322D. That is, one end (first end) of the bonding wire 322A is bonded to the connection 350A, and the other end (second end) of the bonding wire 322A is bonded to the connection 321A of the microstrip line 321. One end (first end) of the bonding wire 322B is bonded to the connection 350B, and the other end (second end) of the bonding wire 322B is bonded to the connection 321B of the microstrip line 321. One end (first end) of the bonding wire 322C is bonded to the connection 350C, and the other end (second end) of the bonding wire 322C is bonded to the connection 321C of the microstrip line 321. One end (first end) of the bonding wire 322D is bonded to the connection 350D, and the other end (second end) of the bonding wire 322D is bonded to the connection 321D of the microstrip line 321. Thus, connection between the output signal line 302 and the output terminal of the carrier amplifier 300 is realized. Although the bonding wires 322A, 322B, 322C, 322D do not intersect with each other in FIG. 6, the present disclosure is not limited thereto. Some of the bonding wires 322A, 322B, 322C, 322D may intersect with each other. The bonding wires 322A, 322B, 322C, 322D may be parallel to each other.

On the output side (i.e., a side in the X2 direction) of the peak amplifier 400, the output signal line 301 is disposed. The microstrip line 311 is connected to an output terminal (not shown) of the impedance conversion circuit 310. Of the connections 450A, 450B, 450C, 450D of the drain terminal 450 of the peak amplifier 400, two connections 450C, 450D on a side close to the carrier amplifier 300 (on a side in the Y direction) are connected to the microstrip line 311 by the bonding wires 312A, 312B. That is, one end (second end) of the bonding wire 312A is bonded to the connection 450C, and the other end (first end) of the bonding wire 312A is bonded to the connection 311A of the microstrip line 311. One end (second end) of the bonding wire 312B is bonded to the connection 450D, and the other end (first end) of the bonding wire 312B is bonded to the connection 311B of the microstrip line 311. Thus, connection between the output signal line 301 and the output terminal of the peak amplifier 400 is realized. Although the bonding wires 312A, 312B do not intersect with each other in FIG. 6, the present disclosure is not limited thereto. The bonding wires 312A, 312B may intersect with each other. The bonding wires 312A, 312B may be parallel to each other. The bonding wires 312A, 312B may be parallel to the bonding wires 322A, 322B, 322C, 322D.

On the output side (i.e., a side in the X2 direction) of the peak amplifier 400, the output signal line 401 is disposed. The microstrip line 411 is connected to an input terminal (not shown) of the impedance conversion circuit 410. Of the connections 450A, 450B, 450C, 450D of the drain terminal 450 of the peak amplifier 400, two connections 450A, 450B on a side far from the carrier amplifier 300 (on the opposite side in the Y direction) are connected to the microstrip line 411 by the bonding wires 412A, 412B. One end (first end) of the bonding wire 412A is bonded to the connection 450A, and the other end (second end) of the bonding wire 412A is bonded to the connection 411A of the microstrip line 411. One end (first end) of the bonding wire 412B is bonded to the connection 450B, and the other end (second end) of the bonding wire 412B is bonded to the connection 411B of the microstrip line 411. Thus, connection between the output signal line 401 and the output terminal of the peak amplifier 400 is realized. Although the bonding wires 412A, 412B do not intersect with each other in FIG. 6, the present disclosure is not limited thereto. The bonding wires 412A, 412B may intersect with each other. The bonding wires 412A, 412B may be parallel to each other. The bonding wires 412A, 412B may be parallel to the bonding wires 322A, 322B, 322C, 322D. Moreover, the bonding wires 312A, 312B, 412A, 412B may be disposed as shown in FIG. 3B, FIG. 3C.

A direction from the drain terminal 450 of the peak amplifier 400 to the connections 311A, 311B of the microstrip line 311 is the X2 direction. A direction from the drain terminal 450 of the peak amplifier 400 to the connections 411A, 411B of the microstrip line 411 is the X2 direction. That is, the direction from the drain terminal 450 of the peak amplifier 400 to the connections 311A, 311B of the microstrip line 311 is the same direction as the direction from the drain terminal 450 of the peak amplifier 400 to the connections 411A, 411B of the microstrip line 411. Therefore, the drain terminal 450 of the peak amplifier 400 need not be bent, whereby the impedance on the peak amplifier 400 side from the coupling point in the back-off operation can be inhibited from deviating from the open state. Furthermore, an increase in size of the Doherty amplifier circuit 500 can be inhibited.

A direction from the gate terminal 440 to the drain terminal 450 of the peak amplifier 400 is the X2 direction. That is, the direction from the gate terminal 440 to the drain terminal 450 of the peak amplifier 400 is the same direction as a direction from the drain terminal 450 of the peak amplifier 400 to the connections 311A, 311B of the microstrip line 311. Therefore, the drain terminal 450 of the peak amplifier 400 need not be bent, whereby the impedance on the peak amplifier 400 side from the coupling point in the back-off operation can be inhibited from deviating from the open state. Furthermore, an increase in size of the Doherty amplifier circuit 500 can be inhibited.

Furthermore, the direction from the gate terminal 440 to the drain terminal 450 of the peak amplifier 400 is the same direction as a direction from the drain terminal 450 of the peak amplifier 400 to the connections 411A, 411B of the microstrip line 411. Therefore, the drain terminal 450 of the peak amplifier 400 need not be bent, thereby inhibiting an increase in size of the Doherty amplifier circuit 500.

A direction from the drain terminal 350 of the carrier amplifier 300 to the connections 321A, 321B, 321C, 321D of the microstrip line 321 is the X2 direction. That is, the direction from the drain terminal 350 of the carrier amplifier 300 to the connections 321A, 321B, 321C, 321D of the microstrip line 321 is the same direction as the direction from the drain terminal 450 of the peak amplifier 400 to the connections 311A, 311B of the microstrip line 311. Thus, the wiring directions of the bonding wires 322A, 322B, 322C, 322D, 312A, 312B can be aligned within a certain range. Therefore, the manufacturing process is prevented from being complicated due to the wiring directions of the bonding wires being not aligned.

A direction from the gate terminal 340 to the drain terminal 350 of the carrier amplifier 300 is the X2 direction. That is, the direction from the gate terminal 340 to the drain terminal 350 of the carrier amplifier 300 is the same direction as the direction from the drain terminal 350 of the carrier amplifier 300 to the connections 321A, 321B, 321C, 321D of the microstrip line 321. Therefore, the drain terminal 350 of the carrier amplifier 300 need not be bent, thereby inhibiting an increase in size of the carrier amplifier 300.

The carrier amplifier 300 and the peak amplifier 400 are disposed along the Y direction. The direction from the gate terminal 340 to the drain terminal 350 of the carrier amplifier 300 is the same direction as the direction from the gate terminal 440 to the drain terminal 450 of the peak amplifier 400. Thus, the microstrip lines 311, 321 and the impedance conversion circuit 310 can be disposed on the output side of the carrier amplifier 300 and the peak amplifier 400. Thus, the components of the Doherty amplifier circuit 500 can be efficiently arranged, thereby inhibiting an increase in size of the Doherty amplifier circuit 500.

3. Third Embodiment

Figure 7:
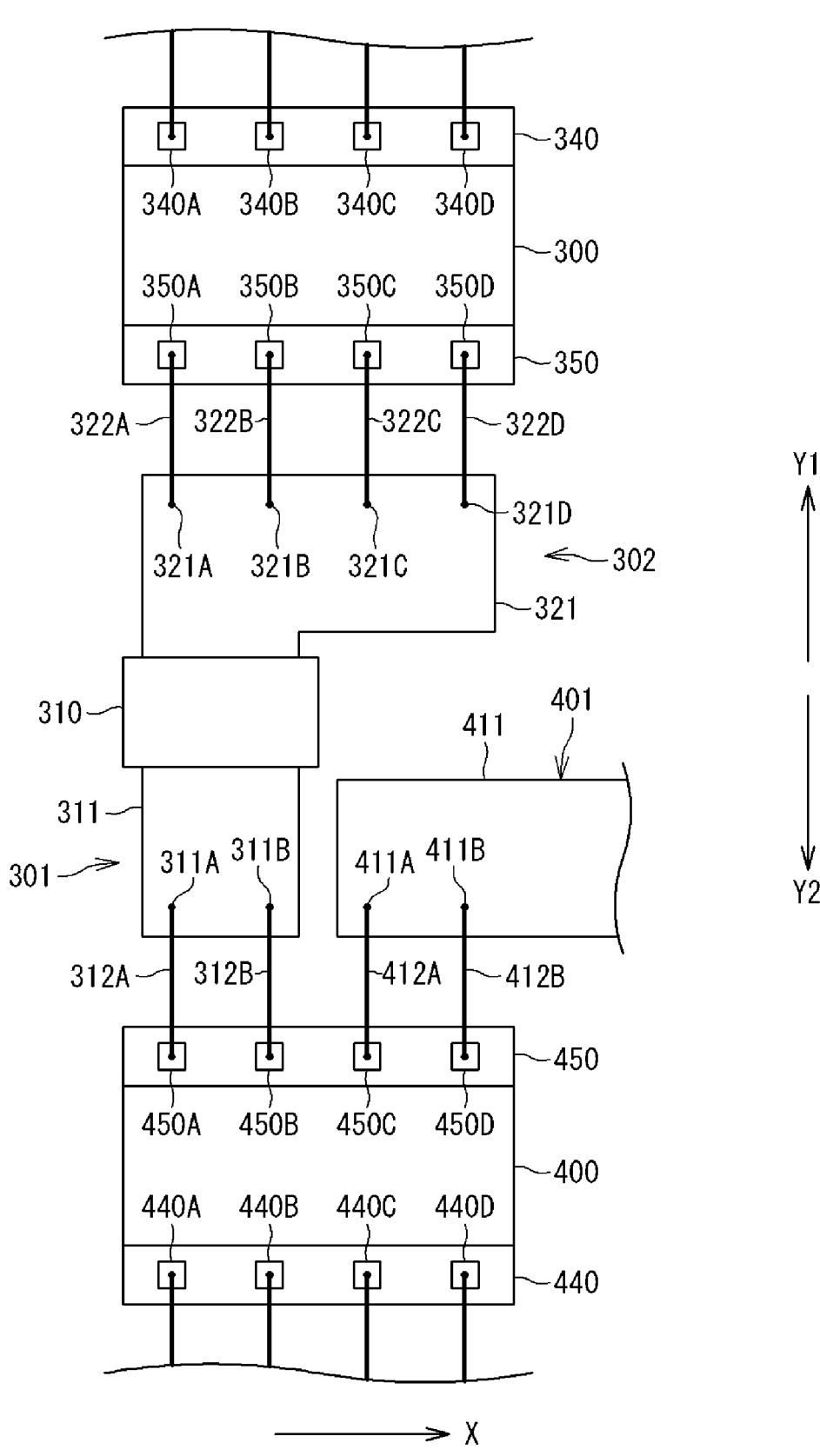
FIG. 7 is a plan view showing connection structures of signal lines in a carrier amplifier and a peak amplifier according to a third embodiment.

FIG. 7 is a plan view showing signal line connection structures in a carrier amplifier and a peak amplifier according to the third embodiment. In FIG. 7, a Y1 direction and a Y2 direction are directions opposite to each other. In FIG. 7, both the Y1 direction and the Y2 direction indicate the vertical direction. In FIG. 7, the Y1 direction indicates an upward direction, and the Y2 direction indicates a downward direction. The Y1 direction and the Y2 direction are opposite to each other. An X direction is a direction orthogonal to the Y1 and Y2 directions.

The carrier amplifier 300 and the peak amplifier 400 are disposed along the Y1 direction. The carrier amplifier 300 is disposed such that the direction from the gate terminal 340 to the drain terminal 350 is the Y2 direction. The peak amplifier 400 is disposed such that the direction from the gate terminal 440 to the drain terminal 450 is the Y1 direction. That is, the direction from the gate terminal 340 to the drain terminal 350 of the carrier amplifier 300 and the direction from the gate terminal 440 to the drain terminal 450 of the peak amplifier 400 are opposite directions.

On the output side (i.e., a side in the Y2 direction) of the carrier amplifier 300, the microstrip line 321 is disposed. That is, the drain terminal 350 of the carrier amplifier 300 and the microstrip line 321 are opposed to each other in the Y1 direction. The bonding wires 322A, 322B, 322C, 322D extend in the Y2 direction, and connect the connections 350A, 350B, 350C, 350D of the drain terminal 350 to the connections 321A, 321B, 321C, 321D of the microstrip line 321, respectively.

On the output side (i.e., a side in the Y1 direction) of the peak amplifier 400, the microstrip line 311 is disposed. That is, the drain terminal 450 of the peak amplifier 400 and the microstrip line 311 are opposed to each other in the Y1 direction. The bonding wires 312A, 312B extend along the Y1 direction, and connect the connections 450A, 450B of the drain terminal 450 to the connections 311A, 311B of the microstrip line 311, respectively.

On the output side (i.e., a side in the Y1 direction) of the peak amplifier 400, the microstrip line 411 is disposed. That is, the drain terminal 450 of the peak amplifier 400 and the microstrip line 411 are opposed to each other in the Y1 direction. The bonding wires 412A, 412B extend along the Y1 direction, and connect the connections 450C, 450D of the drain terminal 450 to the connections 411A, 411B of the microstrip line 411.

A direction from the drain terminal 450 of the peak amplifier 400 to the connections 311A, 311B of the microstrip line 311 is the Y1 direction. A direction from the drain terminal 450 of the peak amplifier 400 to the connections 411A, 411B of the microstrip line 411 is the Y1 direction. That is, the direction from the drain terminal 450 of the peak amplifier 400 to the connections 311A, 311B of the microstrip line 311 is the same direction as the direction from the drain terminal 450 of the peak amplifier 400 to the connections 411A, 411B of the microstrip line 411. Therefore, the drain terminal 450 of the peak amplifier 400 need not be bent, whereby the impedance on the peak amplifier 400 side from the coupling point in the back-off operation can be inhibited from deviating from the open state. Furthermore, an increase in size of the Doherty amplifier circuit 500 can be inhibited.

The direction from the gate terminal 440 to the drain terminal 450 of the peak amplifier 400 is the Y1 direction. That is, the direction from the gate terminal 440 to the drain terminal 450 of the peak amplifier 400 is the same direction as the direction from the drain terminal 450 of the peak amplifier 400 to the connections 311A, 311B of the microstrip line 311. Therefore, the drain terminal 450 of the peak amplifier 400 need not be bent, whereby the impedance on the peak amplifier 400 side from the coupling point in the back-off operation can be inhibited from deviating from the open state. Furthermore, an increase in size of the Doherty amplifier circuit 500 can be inhibited.

Furthermore, the direction from the gate terminal 440 to the drain terminal 450 of the peak amplifier 400 is the same direction as the direction from the drain terminal 450 of the peak amplifier 400 to the connections 411A, 411B of the microstrip line 411. Therefore, the drain terminal 450 of the peak amplifier 400 need not be bent, thereby inhibiting an increase in size of the Doherty amplifier circuit 500.

The direction from the drain terminal 350 of the carrier amplifier 300 to the connections 321A, 321B, 321C, 321D of the microstrip line 321 is the Y2 direction. That is, the direction from the drain terminal 350 of the carrier amplifier 300 to the connections 321A, 321B, 321C, 321D of the microstrip line 321 is a direction opposite to the direction from the drain terminal 450 of the peak amplifier 400 to the connections 311A, 311B of the microstrip line 311. Thus, the wiring directions of the bonding wires 322A, 322B, 322C, 322D, 312A, 312B can be aligned within a certain range. Therefore, the manufacturing process is prevented from being complicated due to the wiring directions of the bonding wires being not aligned.

The direction from the gate terminal 340 to the drain terminal 350 of the carrier amplifier 300 is the Y2 direction. That is, the direction from the gate terminal 340 to the drain terminal 350 of the carrier amplifier 300 is the same direction as the direction from the drain terminal 350 of the carrier amplifier 300 to the connections 321A, 321B, 321C, 321D of the microstrip line 321. Therefore, the drain terminal 350 of the carrier amplifier 300 need not be bent, thereby inhibiting an increase in size of the carrier amplifier 300.

The carrier amplifier 300 and the peak amplifier 400 are disposed along the Y1 direction. The direction from the gate terminal 340 to the drain terminal 350 of the carrier amplifier 300 is a direction opposite to the direction from the gate terminal 440 to the drain terminal 450 of the peak amplifier 400. Thus, the microstrip lines 311, 321 and the impedance conversion circuit 310 can be disposed between the carrier amplifier 300 and the peak amplifier 400. Thus, the components of the Doherty amplifier circuit 500 can be efficiently arranged, thereby inhibiting an increase in size of the Doherty amplifier circuit 500.

4. Fourth Embodiment

Figure 8:
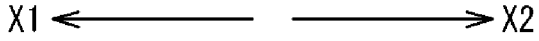
FIG. 8 is a plan view showing connection structures of signal lines in a carrier amplifier and a peak amplifier according to a fourth embodiment.

FIG. 8 is a plan view showing signal line connection structures in a carrier amplifier and a peak amplifier according to a fourth embodiment. In FIG. 8, an X1 direction and an X2 direction are directions opposite to each other. A Y direction is a direction orthogonal to the X1 and X2 directions.

The carrier amplifier 300 and the peak amplifier 400 are disposed along the Y direction. The carrier amplifier 300 is disposed such that the direction from the gate terminal 340 to the drain terminal 350 is the X2 direction. The peak amplifier 400 is disposed such that the direction from the gate terminal 440 to the drain terminal 450 is the X2 direction. That is, the direction from the gate terminal 340 to the drain terminal 350 of the carrier amplifier 300 is the same direction as the direction from the gate terminal 440 to the drain terminal 450 of the peak amplifier 400.

On the output side (i.e., a side in the X2 direction) of the carrier amplifier 300, the output signal line 301 is disposed. In the present embodiment, the drain terminal 350 of the carrier amplifier 300 and the drain terminal 450 of the peak amplifier 400 are connected to each other by the output signal line 301.

The output signal line 301 includes the microstrip line 311, the bonding wires 312A, 312B, and bonding wires (third bonding wires) 313A, 313B, 313C, 313D. The microstrip line 311 is connected to the connections 350A, 350B, 350C, 350D by the bonding wires 313A, 313B, 313C, 313D, respectively. That is, one end (first end) of the bonding wire 313A is bonded to the connection 350A, and the other end (second end) of the bonding wire 313A is bonded to the connection 314A of the microstrip line 311. One end (first end) of the bonding wire 313B is bonded to the connection 350B, and the other end (second end) of the bonding wire 313B is bonded to the connection 314B of the microstrip line 311. One end (first end) of the bonding wire 313C is bonded to the connection 350C, and the other end (second end) of the bonding wire 313C is bonded to the connection 314C of the microstrip line 311. One end (first end) of the bonding wire 313D is bonded to the connection 350D, and the other end (second end) of the bonding wire 313D is bonded to the connection 314D of the microstrip line 311. Thus, connection between the output signal line 301 and the output terminal of the carrier amplifier 300 is realized. Although the bonding wires 313A, 313B, 313C, 313D do not intersect with each other in FIG. 8, the present disclosure is not limited thereto. Some of the bonding wires 313A, 313B, 313C, 313D may intersect with each other. The bonding wires 313A, 313B, 313C, 313D may be parallel to each other.

On the output side (i.e., a side in the X2 direction) of the peak amplifier 400, the output signal line 301 is disposed. Of the connections 450A, 450B, 450C, 450D of the drain terminal 450 of the peak amplifier 400, two connections 450C, 450D on a side close to the carrier amplifier 300 (on a side in the Y direction) are connected to the microstrip line 311 by the bonding wires 312A, 312B. That is, one end (second end) of the bonding wire 312A is bonded to the connection 450C, and the other end (first end) of the bonding wire 312A is bonded to the connection 311A of the microstrip line 311. One end (second end) of the bonding wire 312B is bonded to the connection 450D, and the other end (first end) of the bonding wire 312B is bonded to the connection 311B of the microstrip line 311. Thus, connection between the output signal line 301 and the output terminal of the peak amplifier 400 is realized. Although the bonding wires 312A, 312B do not intersect with each other in FIG. 8, the present disclosure is not limited thereto. The bonding wires 312A, 312B may intersect with each other. The bonding wires 312A, 312B may be parallel to each other. The bonding wires 312A, 312B may be parallel to the bonding wires 313A, 313B, 313C, 313D.

On the output side (i.e., a side in the X2 direction) of the peak amplifier 400, the output signal line 401 is disposed. The microstrip line 411 is connected to an input terminal (not shown) of the impedance conversion circuit 410. Of the connections 450A, 450B, 450C, 450D of the drain terminal 450 of the peak amplifier 400, two connections 450A, 450B on a side far from the carrier amplifier 300 (on the opposite side in the Y direction) are connected to the microstrip line

411 by the bonding wires 412A, 412B. That is, one end (first end) of the bonding wire 412A is bonded to the connection 450A, and the other end (second end) of the bonding wire 412A is bonded to the connection 411A of the microstrip line 411. One end (first end) of the bonding wire 412B is bonded to the connection 450B, and the other end (second end) of the bonding wire 412B is bonded to the connection 411B of the microstrip line 411. Thus, connection between the output signal line 401 and the output terminal of the peak amplifier 400 is realized. Although the bonding wires 412A, 412B do not intersect in FIG. 8, the present disclosure is not limited thereto. The bonding wires 412A, 412B may intersect with each other. The bonding wires 412A, 412B may be parallel to each other. The bonding wires 412A, 412B may be parallel to the bonding wires 313A, 313B, 313C, 313D. Furthermore, the bonding wires 312A, 312B, 412A, 412B may be arranged as shown in FIG. 3B, FIG. 3C.

A direction from the drain terminal 450 of the peak amplifier 400 to the connections 311A, 311B of the microstrip line 311 is the X2 direction. A direction from the drain terminal 450 of the peak amplifier 400 to the connections 411A, 411B of the microstrip line 411 is the X2 direction. That is, the direction from the drain terminal 450 of the peak amplifier 400 to the connections 311A, 311B of the microstrip line 311 is the same direction as the direction from the drain terminal 450 of the peak amplifier 400 to the connections 411A, 411B of the microstrip line 411. Thus, the drain terminal 450 of the peak amplifier 400 need not be bent, whereby the impedance on the peak amplifier 400 side from the coupling point in the back-off operation can be inhibited from deviating from the open state. Furthermore, an increase in size of the Doherty amplifier circuit 500 can be inhibited.

The direction from the gate terminal 440 to the drain terminal 450 of the peak amplifier 400 is the X2 direction. That is, the direction from the gate terminal 440 to the drain terminal 450 of the peak amplifier 400 is the same direction as the direction from the drain terminal 450 of the peak amplifier 400 to the connections 311A, 311B of the microstrip line 311. Therefore, the drain terminal 450 of the peak amplifier 400 need not be bent, whereby the impedance on the peak amplifier 400 side from the coupling point in the back-off operation can be inhibited from deviating from the open state. Furthermore, an increase in size of the Doherty amplifier circuit 500 can be inhibited.

Furthermore, the direction from the gate terminal 440 to the drain terminal 450 of the peak amplifier 400 is the same direction as the direction from the drain terminal 450 of the peak amplifier 400 to the connections 411A, 411B of the microstrip line 411. Therefore, the drain terminal 450 of the peak amplifier 400 need not be bent, thereby inhibiting an increase in size of the Doherty amplifier circuit 500.

A direction from the drain terminal 350 of the carrier amplifier 300 to the connections 314A, 314B, 314C, 314D of the microstrip line 311 is the X2 direction. That is, the direction from the drain terminal 350 of the carrier amplifier 300 to the connections 314A, 314B, 314C, 314D of the microstrip line 311 is the same direction as the direction from the drain terminal 450 of the peak amplifier 400 to the connections 311A, 311B of the microstrip line 311. Thus, the wiring directions of the bonding wires 313A, 313B, 313C, 313D, 312A, 312B can be aligned within a certain range. Therefore, the manufacturing process is prevented from being complicated due to the wiring directions of the bonding wires being not aligned.

The direction from the gate terminal 340 to the drain terminal 350 of the carrier amplifier 300 is the X2 direction.

That is, the direction from the gate terminal 340 to the drain terminal 350 of the carrier amplifier 300 is the same direction as the direction from the drain terminal 350 of the carrier amplifier 300 to the connections 314A, 314B, 314C, 314D of the microstrip line 311. Therefore, the drain terminal 350 of the carrier amplifier 300 need not be bent, thereby inhibiting an increase in size of the carrier amplifier 300.

The carrier amplifier 300 and the peak amplifier 400 are disposed along the Y direction. The direction from the gate terminal 340 to the drain terminal 350 of the carrier amplifier 300 is the same direction as direction from the gate terminal 440 to the drain terminal 450 of the peak amplifier 400. Thus, the microstrip line 311 can be disposed on the output side of the carrier amplifier 300 and the peak amplifier 400. Thus, the components of the Doherty amplifier circuit 500 can be efficiently arranged, thereby inhibiting an increase in size of the Doherty amplifier circuit 500.

5. Fifth Embodiment

Figure 9:
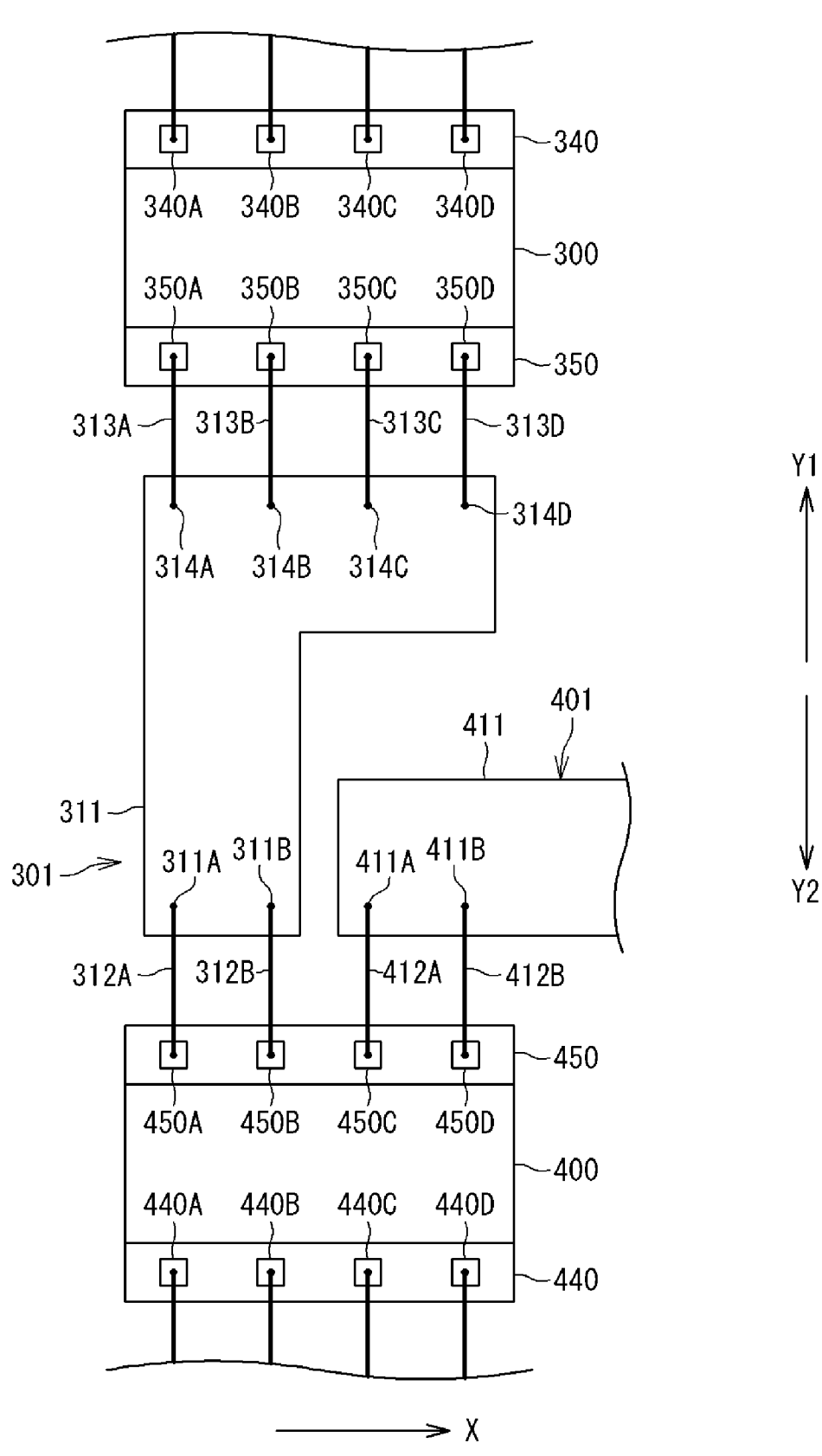
FIG. 9 is a plan view showing connection structures of signal lines in a carrier amplifier and a peak amplifier according to a fifth embodiment.

FIG. 9 is a plan view showing signal line connection structures in a carrier amplifier and a peak amplifier according to a fifth embodiment. In FIG. 9, a Y1 direction and a Y2 direction are directions opposite to each other. An X direction is a direction orthogonal to the Y1 and Y2 directions.

The carrier amplifier 300 and the peak amplifier 400 are disposed along the Y1 direction. The carrier amplifier 300 is disposed such that the direction from the gate terminal 340 to the drain terminal 350 is the Y2 direction. The peak amplifier 400 is disposed such that the direction from the gate terminal 440 to the drain terminal 450 is the Y1 direction. That is, the direction from the gate terminal 340 to the drain terminal 350 of the carrier amplifier 300 and the direction from the gate terminal 440 to the drain terminal 450 of the peak amplifier 400 are opposite directions.

On the output side (i.e., a side in the Y2 direction) of the carrier amplifier 300, the output signal line 301 is disposed. In the present embodiment, the drain terminal 350 of the carrier amplifier 300 and the drain terminal 450 of the peak amplifier 400 are connected to each other by the output signal line 301.

On the output side (i.e., a side in the Y2 direction) of the carrier amplifier 300, the microstrip line 311 is disposed. That is, the drain terminal 350 of the carrier amplifier 300 and the microstrip line 311 are opposed to each other in the Y1 direction. The bonding wires 313A, 313B, 313C, 313D extend along the Y2 direction, and connect the connections 350A, 350B, 350C, 350D of the drain terminal 350 to the connections 314A, 314B, 314C, 314D of the microstrip line 311, respectively.

On the output side (i.e., a side in the Y1 direction) of the peak amplifier 400, the microstrip line 311 is disposed. That is, the drain terminal 450 of the peak amplifier 400 and the microstrip line 311 are opposed to each other in the Y1 direction. The bonding wires 312A, 312B extend along the Y1 direction, and connect the connections 450A, 450B of the drain terminal 450 to the connections 311A, 311B of the microstrip line 311, respectively.

On the output side (i.e., a side in the Y1 direction) of the peak amplifier 400, the microstrip line 411 is disposed. That is, the drain terminal 450 of the peak amplifier 400 and the microstrip line 411 are opposed to each other in the Y1 direction. The bonding wires 412A, 412B extend along the Y1 direction, and connect the connections 450C, 450D of the drain terminal 450 to the connections 411A, 411B of the microstrip line 411, respectively.

The direction from the drain terminal 450 of the peak amplifier 400 to the connections 311A, 311B of the microstrip line 311 is the Y1 direction. The direction from the drain terminal 450 of the peak amplifier 400 to the connections 411A, 411B of the microstrip line 411 is the Y1 direction. That is, the direction from the drain terminal 450 of the peak amplifier 400 to the connections 311A, 311B of the microstrip line 311 is the same direction as the direction from the drain terminal 450 of the peak amplifier 400 to the connections 411A, 411B of the microstrip line 411. Thus, the drain terminal 450 of the peak amplifier 400 need not be bent, whereby the impedance on the peak amplifier 400 side from the coupling point in the back-off operation can be inhibited from deviating from the open state. Furthermore, an increase in size of the Doherty amplifier circuit 500 can be inhibited.

The direction from the gate terminal 440 to the drain terminal 450 of the peak amplifier 400 is the Y1 direction. That is, the direction from the gate terminal 440 to the drain terminal 450 of the peak amplifier 400 is the same direction as the direction from the drain terminal 450 of the peak amplifier 400 to the connections 311A, 311B of the microstrip line 311. Thus, the drain terminal 450 of the peak amplifier 400 need not be bent, whereby the impedance on the peak amplifier 400 from the coupling point in the back-off operation can be inhibited from deviating from the open state. Furthermore, an increase in size of the Doherty amplifier circuit 500 can be inhibited.

Furthermore, the direction from the gate terminal 440 to the drain terminal 450 of the peak amplifier 400 is the same direction as the direction from the drain terminal 450 of the peak amplifier 400 to the connections 411A, 411B of the microstrip line 411. Therefore, the drain terminal 450 of the peak amplifier 400 need not be bent, thereby inhibiting an increase in size of the Doherty amplifier circuit 500.

The direction from the drain terminal 350 of the carrier amplifier 300 to the connections 314A, 314B, 314C, 314D of the microstrip line 311 is the Y2 direction. That is, the direction from the drain terminal 350 of the carrier amplifier 300 to the connections 314A, 314B, 314C, 314D of the microstrip line 311 is opposite to the direction from the drain terminal 450 of the peak amplifier 400 to the connections 311A, 311B of the microstrip line 311. Thus, the wiring directions of the bonding wires 313A, 313B, 313C, 313D, 312A, 312B can be aligned within a certain range. Therefore, the manufacturing process is prevented from being complicated due to the wiring directions of the bonding wires being not aligned.

The direction from the gate terminal 340 to the drain terminal 350 of the carrier amplifier 300 is the Y2 direction. That is, the direction from the gate terminal 340 to the drain terminal 350 of the carrier amplifier 300 is the same direction as the direction from the drain terminal 350 of the carrier amplifier 300 to the connections 314A, 314B, 314C, 314D of the microstrip line 311. Therefore, the drain terminal 350 of the carrier amplifier 300 need not be bent, thereby inhibiting an increase in size of the carrier amplifier 300.

The carrier amplifier 300 and the peak amplifier 400 are disposed along the Y1 direction. The direction from the gate terminal 340 to the drain terminal 350 of the carrier amplifier 300 is a direction opposite to the direction from the gate terminal 440 to the drain terminal 450 of the peak amplifier 400. Thus, the microstrip line 311 can be disposed between the carrier amplifier 300 and the peak amplifier 400. Thus, the components of the Doherty amplifier circuit 500 can be efficiently arranged, thereby inhibiting an increase in size of the Doherty amplifier circuit 500.

6. Modification

In the embodiments described above, the output signal line 301 includes the two bonding wires 312A, 312B, and the output signal line 401 includes the two bonding wires 412A, 412B. However, the present disclosure is not limited thereto. Any number of bonding wires may be included in the output signal lines 301, 401. For example, the number of bonding wires may be determined according to the power of a signal to be transmitted. That is, the number of bonding wires is determined such that the maximum power to be transmitted through one bonding wire is equal to or lower than an allowable value. The same applies to the bonding wires 322A, 322B, 322C, 322D and the bonding wires 313A, 313B, 313C, 313D. Furthermore, in the embodiments described above, the output signal line 301 is directly connected to the output terminal (drain terminal) of the peak amplifier 400. However, the present disclosure is not limited thereto. For example, an extremely small impedance (e.g., several ohms or less) may be provided between the output signal line 301 and the drain terminal. That is, the output signal line 301 may be substantially directly connected to the drain terminal of the peak amplifier 400.

7. Effects

The amplifier circuit 100 includes the Doherty amplifier circuit 500. The Doherty amplifier circuit 500 includes the carrier amplifier 300, the output signal line 301, the peak amplifier 400, and the output signal line 401. The carrier amplifier 300 is composed of a transistor chip (first transistor chip). The output signal line 301 transmits the first amplified signal outputted from the carrier amplifier 300. The peak amplifier 400 is composed of a transistor (second transistor). The output signal line 401 transmits a synthetic signal of a first amplified signal outputted from the carrier amplifier 300 and a second amplified signal outputted from the peak amplifier 400. The output signal line 301 includes the microstrip line 311 provided on a printed-circuit board, and the bonding wires 312A, 312B. The bonding wires 312A, 312B each include the first end connected to the microstrip line 311 and the second end connected to the drain terminal 450 of the peak amplifier 400. The output signal line 401 includes the microstrip line 411 isolated from the microstrip line 311 on the printed-circuit board, and the bonding wires 412A, 412B. The bonding wires 412A, 412B each include the first end connected to the drain terminal 450 of the peak amplifier 400, and the second end connected to the microstrip line 411. A direction from the drain terminal 450 of the peak amplifier 400 to the connections 311A, 311B, of the microstrip line 311, with the first ends of the bonding wires 312A, 312B is the same direction as a direction from the drain terminal 450 of the peak amplifier 400 to the connections 411A, 411B, of the microstrip line 411, with the second ends of the bonding wires 412A, 412B. Thus, a coupling point of an output from the carrier amplifier 300 and an output from the peak amplifier 400 becomes the drain terminal 450 of the peak amplifier 400. Therefore, wiring from the drain terminal 450 of the peak amplifier 400 to the coupling point is eliminated, whereby an impedance on the peak amplifier 400 side from the coupling point in the back-off operation can be made close to the open state without providing a delay line. Furthermore, since the direction from the drain terminal 450 of the peak amplifier 400 to the connections 311A, 311B, of the microstrip line 311, with the first ends of the bonding wires 312A, 312B is aligned with the direction from the drain terminal 450 of the peak amplifier 400 to the connections 411A, 411B, of the microstrip line 411, with the second ends of the bonding wires 412A, 412B, the drain terminal 450 of the peak amplifier 400 need not be bent, whereby the impedance on the peak amplifier 400 side from the coupling point in the back-off operation is inhibited from deviating from the open state, and an increase in size of the Doherty amplifier circuit 500 can be inhibited.

The direction from the gate terminal 440 to the drain terminal 450 of the peak amplifier 400 may be the same direction as the direction from the drain terminal 450 of the peak amplifier 400 to the connections 311A, 311B, of the microstrip line 311, with the first ends of the bonding wires 312A, 312B. Thus, the drain terminal 450 of the peak amplifier 400 need not be bent, whereby the impedance on the peak amplifier 400 side from the coupling point in the back-off operation is inhibited from deviating from the open state, and an increase in size of the Doherty amplifier circuit 500 can be inhibited.

The output signal line 301 may further include the bonding wires 313A, 313B, 313C, 313D. The bonding wires 313A, 313B, 313C, 313D each have the first end connected to the drain terminal 350 of the carrier amplifier 300, and the second end connected to the microstrip line 311. The direction from the drain terminal 350 of the carrier amplifier 300 to the connections 314A, 314B, 314C, 314D, of the microstrip line 311, with the second ends of the bonding wires 313A, 313B, 313C, 313D may be the same as or opposite to the direction from the drain terminal 450 of the peak amplifier 400 to the connections 311A, 311B, of the microstrip line 311, with the first ends of the bonding wires 312A, 312B. Thus, the manufacturing process is prevented from being complicated due to the wiring directions of the bonding wires being not aligned.

The direction from the gate terminal 340 to the drain terminal 350 of the carrier amplifier 300 may be the same as the direction from the drain terminal 350 of the carrier amplifier 300 to the connections 314A, 314B, 314C, 314D, of the microstrip line 311, with the second ends of the bonding wires 313A, 313B, 313C, 313D. Thus, the drain terminal 350 of the carrier amplifier 300 need not be bent, thereby inhibiting an increase in size of the carrier amplifier 300.

The Doherty amplifier circuit 500 may further include the impedance conversion circuit 310 and the output signal line 302. The impedance conversion circuit 310 is connected to the drain terminal 450 of the peak amplifier 400 via the output signal line 301. The output signal line 302 connects the drain terminal 350 of the carrier amplifier 300 to the impedance conversion circuit 310. The output signal line 302 may include the microstrip line 321 disposed on the printed-circuit board, and the bonding wires 322A, 322B, 322C, 322D. The microstrip line 321 is connected to the impedance conversion circuit 310. The bonding wires 322A, 322B, 322C, 322D each include the first end connected to the drain terminal 350 of the carrier amplifier 300, and the second end connected to the microstrip line 321. The direction from the drain terminal 350 of the carrier amplifier 300 to the connections 321A, 321B, 321C, 321D, of the microstrip line 321, with the second ends of the bonding wires 322A, 322B, 322C, 322D may be the same as or opposite to the direction from the drain terminal 450 of the peak amplifier 400 to the connections 311A, 311B, of the microstrip line 311, with the first ends of the bonding wires 312A, 312B. Thus, the manufacturing process is prevented from being complicated due to the wiring directions of the bonding wires being not aligned.

The direction from the gate terminal 340 to the drain terminal 350 of the carrier amplifier 300 may be the same direction as the direction from the drain terminal 350 of the carrier amplifier 300 to the connections 321A, 321B, 321C, 321D, of the microstrip line 321, with the second ends of the bonding wires 322A, 322B, 322C, 322D. Thus, the drain terminal 350 of the carrier amplifier 300 need not be bent, thereby inhibiting an increase in size of the carrier amplifier 300.

The carrier amplifier 300 and the peak amplifier 400 may be disposed along a direction that intersects the direction from the drain terminal 450 of the peak amplifier 400 to the connections 311A, 311B, of the microstrip line 311, with the first ends of the bonding wires 312A, 312B. The direction from the gate terminal 340 to the drain terminal 350 of the carrier amplifier 300 may be the same direction as the direction from the gate terminal 440 to the drain terminal 450 of the peak amplifier 400. Thus, the components of the Doherty amplifier circuit 500 can be efficiently arranged, thereby inhibiting an increase in size of the Doherty amplifier circuit 500.

The carrier amplifier 300 and the peak amplifier 400 may be disposed along the direction from the drain terminal 450 of the peak amplifier 400 to the connections 311A, 311B, of the microstrip line 311, with the first ends of the bonding wires 312A, 312B. The direction from the gate terminal 340 to the drain terminal 350 of the carrier amplifier 300 may be opposite to the direction from the gate terminal 440 to the drain terminal 450 of the peak amplifier 400. Thus, the components of the Doherty amplifier circuit 500 can be efficiently arranged, thereby inhibiting an increase in size of the Doherty amplifier circuit 500.

The microstrip line 311 may be disposed between the carrier amplifier 300 and the peak amplifier 400. Thus, the components of the Doherty amplifier circuit 500 can be more efficiently arranged, thereby inhibiting an increase in size of the Doherty amplifier circuit 500.

The Doherty amplifier circuit 500 may further include the impedance conversion circuit 410. The impedance conversion circuit 410 is connected to the drain terminal 450 of the peak amplifier 400 via the output signal line 401. Thus, the load impedance of the entire Doherty amplifier circuit 500 can be adjusted, thereby further enhancing the efficiency.

The bonding wires 312A, 312B may not necessarily intersect with the bonding wires 412A, 412B. Thus, wiring for connecting the output signal line 301 to the drain terminal 450 of the peak amplifier 400 can be simplified.

The bonding wires 312A, 312B may be parallel to the bonding wires 412A, 412B. Thus, wiring for connecting the output signal line 301 to the drain terminal 450 of the peak amplifier 400 can be easily constructed.

The bonding wires 312A, 312B may intersect with the bonding wires 412A, 412B. Thus, the degree of freedom in wiring for connecting the output signal line 301 to the drain terminal 450 of the peak amplifier 400 can be increased.

The amplifier circuit 100 includes the Doherty amplifier circuit 500. The Doherty amplifier circuit 500 includes the carrier amplifier 300, the output signal line 301, the peak amplifier 400, and the output signal line 401. The carrier amplifier 300 is composed of a transistor chip (first transistor chip). The output signal line 301 transmits the first amplified signal outputted from the carrier amplifier 300. The peak amplifier 400 is composed of a transistor (second transistor). The output signal line 401 transmits a synthetic signal of a first amplified signal outputted from the carrier amplifier 300 and a second amplified signal outputted from the peak amplifier 400. The output signal line 301 includes the microstrip line 311 disposed on a printed-circuit board, and the bonding wires 312A, 312B. The bonding wires 312A, 312B each include the first end connected to the microstrip line 311 and the second end connected to the drain terminal 450 of the peak amplifier 400. The output signal line 401 includes the microstrip line 411 isolated from the microstrip line 311 on the printed-circuit board, and the bonding wires 412A, 412B. The bonding wires 412A, 412B each include the first end connected to the drain terminal 450 of the peak amplifier 400, and the second end connected to the microstrip line 411. The direction from the gate terminal 440 to the drain terminal 450 of the peak amplifier 400 is the same direction as the direction from the drain terminal 450 of the peak amplifier 400 to the connections 311A, 311B, of the microstrip line 311, with the first ends of the bonding wires 312A, 312B. Thus, a coupling point of an output from the carrier amplifier 300 and an output from the peak amplifier 400 becomes the drain terminal 450 of the peak amplifier 400. Therefore, wiring from the drain terminal 450 of the peak amplifier 400 to the coupling point is eliminated, whereby an impedance on the peak amplifier 400 side from the coupling point in the back-off operation can be made close to the open state without providing a delay line. Furthermore, since the direction from the gate terminal 440 to the drain terminal 450 of the peak amplifier 400 is aligned with the direction from the drain terminal 450 of the peak amplifier 400 to the connections 311A, 311B, of the microstrip line 311, with the first ends of the bonding wires 312A, 312B, the drain terminal 450 of the peak amplifier 400 need not be bent, whereby the impedance on the peak amplifier 400 side from the coupling point in the back-off operation is inhibited from deviating from the open state, and an increase in size of the Doherty amplifier circuit 500 can be inhibited.

The wireless communication device 10 includes the transmitter circuit 31 and the amplifier circuit 100. The transmitter circuit 31 outputs a radio frequency transmission signal. The amplifier circuit 100 amplifies a transmission signal outputted from the transmitter circuit 31. The amplifier circuit 100 includes the Doherty amplifier circuit 500. The Doherty amplifier circuit 500 includes the carrier amplifier 300, the output signal line 301, the peak amplifier 400, and the output signal line 401. The carrier amplifier 300 is composed of a transistor chip (first transistor chip). The output signal line 301 transmits the first amplified signal outputted from the carrier amplifier 300. The peak amplifier 400 is composed of a transistor (second transistor). The output signal line 401 transmits a synthetic signal of a first amplified signal outputted from the carrier amplifier 300 and a second amplified signal outputted from the peak amplifier 400. The output signal line 301 includes the microstrip line 311 disposed on a printed-circuit board, and the bonding wires 312A, 312B. The bonding wires 312A, 312B each include the first end connected to the microstrip line 311 and the second end connected to the drain terminal 450 of the peak amplifier 400. The output signal line 401 includes the microstrip line 411 isolated from the microstrip line 311 on the printed-circuit board, and the bonding wires 412A, 412B. The bonding wires 412A, 412B each include the first end connected to the drain terminal 450 of the peak amplifier 400, and the second end connected to the microstrip line 411. The direction from the drain terminal 450 of the peak amplifier 400 to the connections 311A, 311B, of the microstrip line 311, with the first ends of the bonding wires 312A, 312B is the same direction as the direction from the drain terminal 450 of the peak amplifier 400 to the connections 411A, 411B, of the microstrip line 411, with the second ends of the bonding wires 412A, 412B. Thus, a coupling point of an output from the carrier amplifier 300 and an output from the peak amplifier 400 becomes the drain terminal 450 of the peak amplifier 400. Therefore, wiring from the drain terminal 450 of the peak amplifier 400 to the coupling point is eliminated, whereby an impedance on the peak amplifier 400 side from the coupling point in the back-off operation can be made close to the open state without providing a delay line. Furthermore, since the direction from the drain terminal 450 of the peak amplifier 400 to the connections 311A, 311B, of the microstrip line 311, with the first ends of the bonding wires 312A, 312B is aligned with the direction from the drain terminal 450 of the peak amplifier 400 to the connections 411A, 411B, of the microstrip line 411, with the second ends of the bonding wires 412A, 412B, the drain terminal 450 of the peak amplifier 400 need not be bent, whereby an impedance on the peak amplifier 400 side from the coupling point in the back-off operation is inhibited from deviating from the open state, and an increase in size of the Doherty amplifier circuit 500 can be inhibited.

The wireless communication device 10 includes the transmitter circuit 31 and the amplifier circuit 100. The transmitter circuit 31 outputs a radio frequency transmission signal. The amplifier circuit 100 amplifies a transmission signal outputted from the transmitter circuit 31. The amplifier circuit 100 includes the Doherty amplifier circuit 500. The Doherty amplifier circuit 500 includes the carrier amplifier 300, the output signal line 301, the peak amplifier 400, and the output signal line 401. The carrier amplifier 300 is composed of a transistor chip (first transistor chip). The output signal line 301 transmits the first amplified signal outputted from the carrier amplifier 300. The peak amplifier 400 is composed of a transistor (second transistor). The output signal line 401 transmits a synthetic signal of a first amplified signal outputted from the carrier amplifier 300 and a second amplified signal outputted from the peak amplifier 400. The output signal line 301 includes the microstrip line 311 disposed on a printed-circuit board, and the bonding wires 312A, 312B. The bonding wires 312A, 312B each include the first end connected to the microstrip line 311 and the second end connected to the drain terminal 450 of the peak amplifier 400. The output signal line 401 includes the microstrip line 411 isolated from the microstrip line 311 on the printed-circuit board, and the bonding wires 412A, 412B. The bonding wires 412A, 412B each include the first end connected to the drain terminal 450 of the peak amplifier 400, and the second end connected to the microstrip line 411. The direction from the gate terminal 440 to the drain terminal 450 of the peak amplifier 400 is the same direction as the direction from the drain terminal 450 of the peak amplifier 400 to the connections 311A, 311B, of the microstrip line 311, with the first ends of the bonding wires 312A, 312B. Thus, a coupling point of an output from the carrier amplifier 300 and an output from the peak amplifier 400 becomes the drain terminal 450 of the peak amplifier 400. Therefore, wiring from the drain terminal 450 of the peak amplifier 400 to the coupling point is eliminated, whereby an impedance on the peak amplifier 400 side from the coupling point in the back-off operation can be made close to the open state without providing a delay line. Furthermore, since the direction from the gate terminal 440 to the drain terminal 450 of the peak amplifier 400 is aligned with the direction from the drain terminal 450 of the peak amplifier 400 to the connections 311A, 311B, of the microstrip line 311, with the first ends of the bonding wires 312A, 312B, the drain terminal 450 of the peak amplifier

400 need not be bent, whereby the impedance on the peak amplifier 400 side from the coupling point in the back-off operation is inhibited from deviating from the open state, and an increase in size of the Doherty amplifier circuit 500 can be inhibited.

8. Additional Note

The embodiments disclosed herein are merely illustrative and not restrictive in all aspects. The scope of the present disclosure is defined by the scope of the claims rather than the embodiment described above, and is intended to include meaning equivalent to the scope of the claims and all modifications within the scope.

REFERENCE SIGNS LIST

10 wireless communication device
21 interface unit
22 signal processing circuit
31 transmitter circuit
32 receiver circuit
40 duplexer
50 antenna
100 amplifier circuit (amplifier module)
200 driver amplifier
201 signal line
210 divider
211, 212 signal line
220, 240 input matching circuit
230 phase shift circuit
300 carrier amplifier (first transistor chip)
301 output signal line (first output signal line)
302 output signal line (third output signal line)
310 impedance conversion circuit (first impedance conversion circuit)
311 microstrip line (first conductor)
311A, 311B connection
312A, 312B bonding wire (first bonding wire)
313A, 313B, 313C, 313D bonding wire (third bonding wire)
314A, 314B, 314C, 314D connection
321 microstrip line (third conductor)
321A, 321B, 321C, 321D connection
322A, 322B, 322C, 322D bonding wire (third bonding wire)
340 input terminal (gate terminal)
340A, 340B, 340C, 340D connection
350 output terminal (drain terminal)
350A, 350B, 350C, 350D connection
400 peak amplifier (transistor, second transistor chip)
401 output signal line (second output signal line)
410 impedance conversion circuit (second impedance conversion circuit)
411 microstrip line (second conductor)
411A, 411B connection
412A, 412B bonding wire (second bonding wire)
430 coupling point
440 input terminal (gate terminal)
440A, 440B, 440C, 440D connection
450 output terminal (drain terminal)
450A, 450B, 450C, 450D connection
500, 500A Doherty amplifier circuit

The invention claimed is:

1. An amplifier module comprising a Doherty amplifier circuit, the Doherty amplifier circuit including a first transistor chip constituting a carrier amplifier, a first output signal line configured to transmit a first amplified signal outputted from the carrier amplifier, a second transistor chip constituting a peak amplifier, and a second output signal line configured to transmit a synthetic signal of the first amplified signal and a second amplified signal outputted from the peak amplifier, the first output signal line including a first conductor provided on a printed-circuit board, and a first bonding wire having a first end connected to the first conductor, and a second end connected to a drain terminal of the second transistor chip, the second output signal line including a second conductor separated from the first conductor on the printed-circuit board, and a second bonding wire having a first end connected to the drain terminal of the second transistor chip, and a second end connected to the second conductor, wherein a direction from the drain terminal of the second transistor chip to a connection, of the first conductor, with the first end of the first bonding wire is the same direction as a direction from the drain terminal of the second transistor chip to a connection, of the second conductor, with the second end of the second bonding wire, the first transistor chip and the second transistor chip are disposed along the direction from the drain terminal of the second transistor chip to the connection, of the first conductor, with the first end of the first bonding wire, a direction from a gate terminal to a drain terminal of the first transistor chip is a direction opposite to a direction from the gate terminal to the drain terminal of the second transistor chip, the first output signal line further includes a third bonding wire having a first end connected to a drain terminal of the first transistor chip and a second end connected to the first conductor, and a direction from the drain terminal of the first transistor chip to a connection, of the first conductor, with the second end of the third bonding wire is the same as or opposite to the direction from the drain terminal of the second transistor chip to the connection, of the first conductor, with the first end of the first bonding wire.

2. The amplifier module according to claim 1, wherein a direction from a gate terminal to the drain terminal of the second transistor chip is the same direction as the direction from the drain terminal of the second transistor chip to the connection, of the first conductor, with the first end of the first bonding wire.

3. The amplifier module according to claim 1, wherein a direction from a gate terminal to the drain terminal of the first transistor chip is the same direction as the direction from the drain terminal of the first transistor chip to the connection, of the first conductor, with the second end of the third bonding wire.

4. The amplifier module according to claim 1, wherein a direction from a gate terminal to the drain terminal of the first transistor chip is the same direction as the direction from the drain terminal of the first transistor chip to the connection, of a third conductor, with the second end of the third bonding wire.

5. The amplifier module according to claim 1, wherein the first transistor chip and the second transistor chip are disposed along a direction that intersects with the direction from the drain terminal of the second transistor chip to the connection, of the first conductor, with the first end of the first bonding wire, and a direction from a gate terminal to a drain terminal of the first transistor chip is the same direction as a direction from a gate terminal to the drain terminal of the second transistor chip.

6. The amplifier module according to claim 1, wherein the first conductor is disposed between the first transistor chip and the second transistor chip.

7. The amplifier module according to claim 1, wherein the Doherty amplifier circuit further includes a second impedance conversion circuit connected to the drain terminal of the second transistor chip via the second output signal line.

8. The amplifier module according to claim 1, wherein the first bonding wire and the second bonding wire do not intersect with each other.

9. The amplifier module according to claim 1, wherein the first bonding wire and the second bonding wire are parallel to each other.

10. The amplifier module according to claim 1, wherein the first bonding wire and the second bonding wire intersect with each other.

11. An amplifier module comprising a Doherty amplifier circuit, the Doherty amplifier circuit including a first transistor chip constituting a carrier amplifier, a first output signal line configured to transmit a first amplified signal outputted from the carrier amplifier, a second transistor chip constituting a peak amplifier, and a second output signal line configured to transmit a synthetic signal of the first amplified signal and a second amplified signal outputted from the peak amplifier, the first output signal line including a first conductor provided on a printed-circuit board, and a first bonding wire having a first end connected to the first conductor, and a second end connected to a drain terminal of the second transistor chip, the second output signal line including a second conductor separated from the first conductor on the printed-circuit board, and a second bonding wire having a first end connected to the drain terminal of the second transistor chip, and a second end connected to the second conductor, wherein a direction from a gate terminal to the drain terminal of the second transistor chip is the same direction as the direction from the drain terminal of the second transistor chip to a connection, of the first conductor, with the first end of the first bonding wire, the first transistor chip and the second transistor chip are disposed along the direction from the drain terminal of the second transistor chip to the connection, of the first conductor, with the first end of the first bonding wire, a direction from a gate terminal to a drain terminal of the first transistor chip is a direction opposite to a direction from a gate terminal to the drain terminal of the second transistor chip, the first output signal line further includes a third bonding wire having a first end connected to a drain terminal of the first transistor chip and a second end connected to the first conductor, and a direction from the drain terminal of the first transistor chip to a connection, of the first conductor, with the second end of the third bonding wire is the same as or opposite to the direction from the drain terminal of the second transistor chip to the connection, of the first conductor, with the first end of the first bonding wire.

12. A communication device comprising:

a transmitter circuit configured to output a radio frequency transmission signal; and an amplifier module configured to amplify the transmission signal outputted from the transmitter circuit, the amplifier module including a Doherty amplifier circuit, the Doherty amplifier circuit including a first transistor chip constituting a carrier amplifier, a first output signal line configured to transmit a first amplified signal outputted from the carrier amplifier, a second transistor chip constituting a peak amplifier, and a second output signal line configured to transmit a synthetic signal of the first amplified signal and a second amplified signal outputted from the peak amplifier, the first output signal line including a first conductor provided on a printed-circuit board, and a first bonding wire having a first end connected to the first conductor, and a second end connected to a drain terminal of the second transistor chip, the second output signal line including a second conductor separated from the first conductor on the printed-circuit board, and a second bonding wire having a first end connected to the drain terminal of the second transistor chip, and a second end connected to the second conductor, wherein a direction from the drain terminal of the second transistor chip to a connection, of the first conductor, with the first end of the first bonding wire is the same direction as a direction from the drain terminal of the second transistor chip to a connection, of the second conductor, with the second end of the second bonding wire, the first transistor chip and the second transistor chip are disposed along the direction from the drain terminal of the second transistor chip to the connection, of the first conductor, with the first end of the first bonding wire, a direction from a gate terminal to a drain terminal of the first transistor chip is a direction opposite to a direction from a gate terminal to the drain terminal of the second transistor chip, the first output signal line further includes a third bonding wire having a first end connected to a drain terminal of the first transistor chip and a second end connected to the first conductor, and a direction from the drain terminal of the first transistor chip to a connection, of the first conductor, with the second end of the third bonding wire is the same as or opposite to the direction from the drain terminal of the second transistor chip to the connection, of the first conductor, with the first end of the first bonding wire.

13. A communication device comprising:

a transmitter circuit configured to output a radio frequency transmission signal; and an amplifier module configured to amplify the transmission signal outputted from the transmitter circuit, the amplifier module including a Doherty amplifier circuit, the Doherty amplifier circuit including a first transistor chip constituting a carrier amplifier, a first output signal line configured to transmit a first amplified signal outputted from the carrier amplifier, a second transistor chip constituting a peak amplifier, and a second output signal line configured to transmit a synthetic signal of the first amplified signal and a second amplified signal outputted from the peak amplifier, the first output signal line including a first conductor provided on a printed-circuit board, and a first bonding wire having a first end connected to the first conductor, and a second end connected to a drain terminal of the second transistor chip, the second output signal line including a second conductor separated from the first conductor on the printed-circuit board, and a second bonding wire having a first end connected to the drain terminal of the second transistor chip, and a second end connected to the second conductor, wherein a direction from a gate terminal to the drain terminal of the second transistor chip is the same direction as the direction from the drain terminal of the second transistor chip to a connection, of the first conductor, with the first end of the first bonding wire, the first transistor chip and the second transistor chip are disposed along the direction from the drain terminal of the second transistor chip to the connection, of the first conductor, with the first end of the first bonding wire, a direction from a gate terminal to a drain terminal of the first transistor chip is a direction opposite to a direction from a gate terminal to the drain terminal of the second transistor chip, the first output signal line further includes a third bonding wire having a first end connected to a drain terminal of the first transistor chip and a second end connected to the first conductor, and a direction from the drain terminal of the first transistor chip to a connection, of the first conductor, with the second end of the third bonding wire is the same as or opposite to the direction from the drain terminal of the second transistor chip to the connection, of the first conductor, with the first end of the first bonding wire.

14. An amplifier module comprising a Doherty amplifier circuit, the Doherty amplifier circuit including a first transistor chip constituting a carrier amplifier, a first output signal line configured to transmit a first amplified signal outputted from the carrier amplifier, a second transistor chip constituting a peak amplifier, and a second output signal line configured to transmit a synthetic signal of the first amplified signal and a second amplified signal outputted from the peak amplifier, the first output signal line including a first conductor provided on a printed-circuit board, and a first bonding wire having a first end connected to the first conductor, and a second end connected to a drain terminal of the second transistor chip, the second output signal line including a second conductor separated from the first conductor on the printed-circuit board, and a second bonding wire having a first end connected to the drain terminal of the second transistor chip, and a second end connected to the second conductor, wherein a direction from the drain terminal of the second transistor chip to a connection, of the first conductor, with the first end of the first bonding wire is the same direction as a direction from the drain terminal of the second transistor chip to a connection, of the second conductor, with the second end of the second bonding wire, the first transistor chip and the second transistor chip are disposed along the direction from the drain terminal of the second transistor chip to the connection, of the first conductor, with the first end of the first bonding wire, a direction from a gate terminal to a drain terminal of the first transistor chip is a direction opposite to a direction from a gate terminal to the drain terminal of the second transistor chip, the Doherty amplifier circuit further includes a first impedance conversion circuit connected to the drain terminal of the second transistor chip via the first output signal line, and a third output signal line connecting a drain terminal of the first transistor chip to the first impedance conversion circuit, the third output signal line includes a third conductor provided on the printed-circuit board, and connected to the first impedance conversion circuit, and a third bonding wire having a first end connected to the drain terminal of the first transistor chip, and a second end connected to the third conductor, and a direction from the drain terminal of the first transistor chip to a connection, of the third conductor, with the second end of the third bonding wire is the same as or opposite to the direction from the drain terminal of the second transistor chip to the connection, of the first conductor, with the first end of the first bonding wire.

\* \* \* \* \*